(12) United States Patent
Chung et al.

(10) Patent No.: US 12,490,428 B2
(45) Date of Patent: Dec. 2, 2025

(54) SEMICONDUCTOR DEVICE INCLUDING VERTICAL MEMORY STRUCTURE AND SEPARATION STRUCTURE EACH INCLUDING SIDE SURFACE SLOPE CHANGING PORTION AND DATA STORAGE SYSTEM INCLUDING THE SAME

(71) Applicant: SAMSUNG ELECTRONICS CO., LTD., Suwon-si (KR)

(72) Inventors: Giyong Chung, Seoul (KR); Seungyoon Kim, Seoul (KR); Jaeryong Sim, Hwaseong-si (KR); Jeehoon Han, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 642 days.

(21) Appl. No.: 17/656,088

(22) Filed: Mar. 23, 2022

(65) Prior Publication Data
US 2022/0310639 A1    Sep. 29, 2022

(30) Foreign Application Priority Data
Mar. 24, 2021    (KR) .................. 10-2021-0038069

(51) Int. Cl.
*H10B 41/35*    (2023.01)
*H01L 23/528*    (2006.01)
(Continued)

(52) U.S. Cl.
CPC ......... *H10B 41/35* (2023.02); *H01L 23/5283* (2013.01); *H01L 25/0657* (2013.01);
(Continued)

(58) Field of Classification Search
CPC ........ H10B 41/35; H10B 43/27; H10B 41/27; H01L 23/5283; H01L 25/0657; H01L 2225/06541
See application file for complete search history.

(56) References Cited

U.S. PATENT DOCUMENTS 10,103,169 B1 *   10/2018  Ge ..................... H10D 64/037
2011/0065270 A1    3/2011  Shim et al.
(Continued)

FOREIGN PATENT DOCUMENTS

KR    10-2011-0029403    3/2011
KR    10-2015-0025224    3/2015
(Continued)

OTHER PUBLICATIONS

Office Action dated Jul. 23, 2025 issued in corresponding to Korean Patent Application No. 10-2021-0038069.

*Primary Examiner* — Davienne N Monbleau
*Assistant Examiner* — Dmitri Mihaliov
(74) *Attorney, Agent, or Firm* — Morgan, Lewis & Bockius LLP

(57) ABSTRACT

A semiconductor device includes a stack structure and an insulation structure that covers the stack structure, a vertical memory structure that penetrates the stack structure, and a separation structure that penetrates the stack structure and has an upper surface located at a higher level than an upper surface of the vertical memory structure. The stack structure includes three gate stack groups stacked in a vertical direction. Each of the three gate stack groups includes gate layers stacked and spaced apart from each other in the vertical direction. At a height level between a lowermost gate layer and an uppermost gate layer, a side surface of the vertical memory structure includes memory side surface slope changing portions, and a side surface of the separation structure includes separation side surface slope changing (Continued)

portions positioned at substantially a same height level as some of the memory side surface slope changing portions.

19 Claims, 22 Drawing Sheets

(51) Int. Cl.
*H01L 25/065* (2023.01)
*H10B 41/27* (2023.01)
*H10B 41/40* (2023.01)
*H10B 43/27* (2023.01)
*H10B 43/35* (2023.01)
*H10B 43/40* (2023.01)

(52) U.S. Cl.
CPC ............ *H10B 41/27* (2023.02); *H10B 41/40* (2023.02); *H10B 43/27* (2023.02); *H10B 43/35* (2023.02); *H10B 43/40* (2023.02)

(56) References Cited

U.S. PATENT DOCUMENTS

| | | |
|---|---|---|
| 2011/0312174 A1 | 12/2011 | Lee et al. |
| 2014/0264625 A1 | 9/2014 | Takahashi et al. |
| 2015/0035036 A1* | 2/2015 | Konno ................. H10B 43/40 257/314 |
| 2015/0061155 A1 | 3/2015 | Seo et al. |
| 2015/0162342 A1 | 6/2015 | Lee et al. |
| 2017/0179026 A1* | 6/2017 | Toyama ............. H01L 23/5226 |
| 2017/0352652 A1 | 12/2017 | Lee |
| 2019/0237476 A1 | 8/2019 | Lee et al. |
| 2020/0203371 A1 | 6/2020 | Lee et al. |
| 2020/0402996 A1 | 12/2020 | Cheon et al. |
| 2021/0028184 A1 | 1/2021 | Kim |
| 2022/0005824 A1* | 1/2022 | Tanaka ................. H10B 41/10 |
| 2022/0109004 A1 | 4/2022 | Lim |
| 2022/0246517 A1* | 8/2022 | Titus ................. H01L 21/76861 |

FOREIGN PATENT DOCUMENTS

| | | |
|---|---|---|
| KR | 10-2016-0067811 | 6/2015 |
| KR | 10-2017-0136364 | 12/2017 |
| KR | 10-2019-0092808 | 8/2019 |
| KR | 10-2020-0078779 | 7/2020 |
| KR | 10-2020-0145102 A | 12/2020 |
| KR | 10-2021-0011789 A | 2/2021 |
| KR | 10-2022-0045830 | 4/2022 |

* cited by examiner

SEMICONDUCTOR DEVICE INCLUDING VERTICAL MEMORY STRUCTURE AND SEPARATION STRUCTURE EACH INCLUDING SIDE SURFACE SLOPE CHANGING PORTION AND DATA STORAGE SYSTEM INCLUDING THE SAME

CROSS-REFERENCE TO RELATED APPLICATION(S)

This U.S. application claims priority under 35 U.S.C § 119 from Korean Patent Application No. 10-2021-0038069, filed on Mar. 24, 2021 in the Korean Intellectual Property Office, the contents of which are herein incorporated by reference in their entirety.

BACKGROUND

Technical Field

Embodiments of the present inventive concept are directed to a semiconductor device and a data system that includes the same.

Discussion of the Related Art

Semiconductor devices that can store high-capacity data in electronic systems that require data storage are in demand. Thus, methods for increasing data storage capacity of semiconductor devices have been studied. For example, to increase the data storage capacity of a semiconductor device, semiconductor devices that include three-dimensional memory cells, instead of two-dimensional memory cells, have been proposed.

In a VNAND flash memory device, a vertical memory structure and a vertical support structure are formed simultaneously, and a gate contact plug, a peripheral contact plug, and a separation structure separating the gate stacked structure are formed through different processes.

SUMMARY

An embodiment of the present inventive concept provides a semiconductor device with increased integration and improved reliability.

Another embodiment of the present inventive concept provides a data storage system that includes a semiconductor device.

According to an embodiment of the present inventive concept, a semiconductor device includes: a first structure; a second structure that includes a stack structure that includes at least three gate stack groups that are stacked on the first structure in a vertical direction and an insulation structure that covers at least a portion of the stack structure; a vertical memory structure that penetrates through at least the stack structure; and a separation structure that penetrates through at least the stack structure and that has an upper surface located at a higher level than an upper surface of the vertical memory structure. Each of the at least three gate stack groups includes gate layers that are stacked and spaced apart from each other in the vertical direction. At a height level between a lowermost gate layer and an uppermost gate layer of the gate layers of the stack structure, a side surface of the vertical memory structure includes a plurality "N" of memory side surface slope changing portions, and a side surface of the separation structure includes "M" of separation side surface slope changing portion that is located at substantially a same height level as "M" of the memory side surface slope changing portion of the plurality "N" of memory side surface slope changing portions, where "M"<"N", "N" is a natural number of 2 or greater and "M" is a natural number of 1 or greater.

According to another embodiment of the present inventive concept, a semiconductor device includes: a lower structure; an upper structure that includes a stack structure that includes at least three gate stack groups that are stacked on the lower structure in a vertical direction and an insulation structure that covers at least a portion of the stack structure; a vertical memory structure that penetrates through at least the stack structure; a peripheral contact plug; a plurality of gate contact plugs; and a separation structure that penetrates through at least the stack structure and that has a line shape in a plan view. Each of the at least three gate stack groups includes gate layers that are stacked and spaced apart from each other in the vertical direction. At a height level between a lowermost gate layer and an uppermost gate layer of the gate layers of the stack structure, each of a side surface of the vertical memory structure and a side surface of the peripheral contact plug includes a plurality "N" of first slope changing portions, a side surface of the separation structure includes "M" of second slope changing portion that is located at substantially a same height level as "M" of the first slope changing portion of the plurality "N" of first slope changing portions, where "M"<"N" and "N" and "M" are natural numbers that differ from each other. At a higher level than the uppermost gate layer, the side surface of the vertical memory structure, the side surface of the peripheral contact plug, the side surface of the separation structure, and a side surface of each of the gate contact plugs includes a first upper slope changing portion located at substantially a same height level, and, at the same height level as the first slope changing portion positioned at the lowermost portion of the plurality "N" of first slope changing portions, the side surface of the separation structure is substantially vertical.

According to an embodiment of the present inventive concept, a data storage system includes: a main substrate; a semiconductor device disposed on the main substrate; and a controller that is electrically connected to the semiconductor device on the main substrate. The semiconductor device includes: a lower structure; an upper structure that includes a stack structure that includes at least three gate stack groups that are stacked on the lower structure in a vertical direction and an insulation structure that covers at least a portion of the stack structure; a vertical memory structure that penetrates through at least the stack structure; a peripheral contact plug; a plurality of gate contact plugs; and a separation structure that penetrates through at least the stack structure and that has a line shape in a plan view. Each of the at least three gate stack groups includes gate layers that are stacked and spaced apart from each other in the vertical direction. At a height level between a lowermost gate layer and an uppermost gate layer of the gate layers of the stack structure, each of a side surface of the vertical memory structure and a side surface of the peripheral contact plug includes a plurality "N" of first slope changing portions, a side surface of the separation structure includes "M" of second slope changing portion that is positioned at substantially a same height level as "M" of the first slope changing portion of the plurality "N" of first slope changing portions, where "M"<"N" and "N" and "M" are natural numbers that differ from each other. At a higher level than the uppermost gate layer, the side surface of the vertical memory structure, the side surface of the peripheral contact plug, the side surface of the separation structure, and a side surface of each of the gate contact plugs each include a first upper slope changing portion located at substantially a same height level, and, at a same height level as the first slope changing portion positioned at the lowermost portion of the plurality "N" of first slope changing portions, the side surface of the separation structure is substantially vertical.

DETAILED DESCRIPTION

Hereinafter, embodiments of the present inventive concept will be described with reference to the accompanying drawings.

Figure 1:
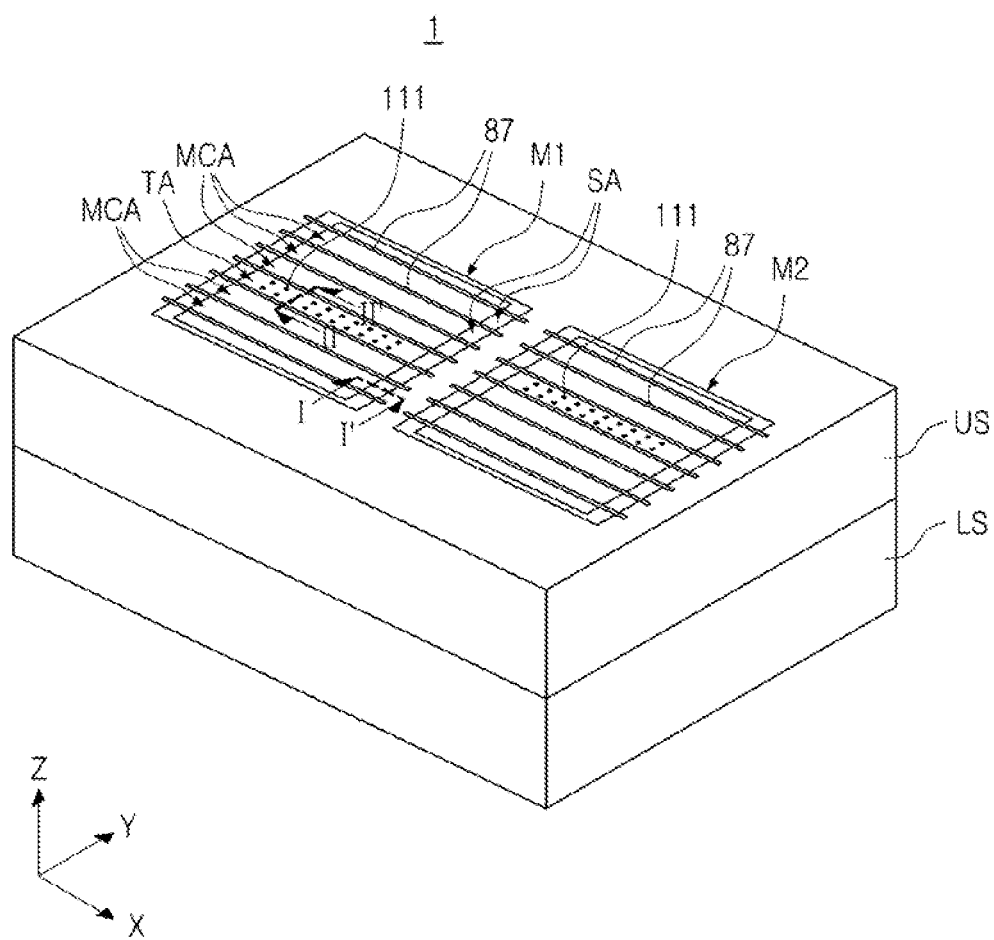
FIG. 1 is a schematic perspective view of a semiconductor device according to embodiments of the present inventive concept.

A semiconductor device according to embodiments of the present inventive concept will be described with reference to FIG. 1. FIG. 1 is a schematic perspective view of a semiconductor device according to embodiments of the present inventive concept.

Referring to FIG. 1, in an embodiment, a semiconductor device 1 includes a first structure LS and a second structure US disposed on the first structure LS. The second structure US includes a plurality of memory structures M1 and M2. Although FIG. 1 shows two memory structures M1 and M2, embodiments are not limited thereto, and in other embodiments, more than two memory structures can be provided. Each of the plurality of memory structures M1 and M2 includes separation structures 87, first regions MCA disposed between the separation structures 87, and second regions SA disposed on at least one side of the first regions MCA.

In an embodiment, the first regions MCA are memory cell array regions or memory cell regions, and the second regions SA are step regions.

In an embodiment, a first region of the first regions MCA, i.e., a memory cell array region, that is disposed between a pair of separation structures 87 spaced apart from each other and parallel to each other is a memory block. Each of the plurality of memory structures M1 and M2 further includes a through region TA disposed between a pair of first regions of the first regions MCA. The semiconductor device 1 further includes peripheral contact plugs 111. At least some of the peripheral contact plugs 111 penetrate through the through region TA.

Figure 2A:
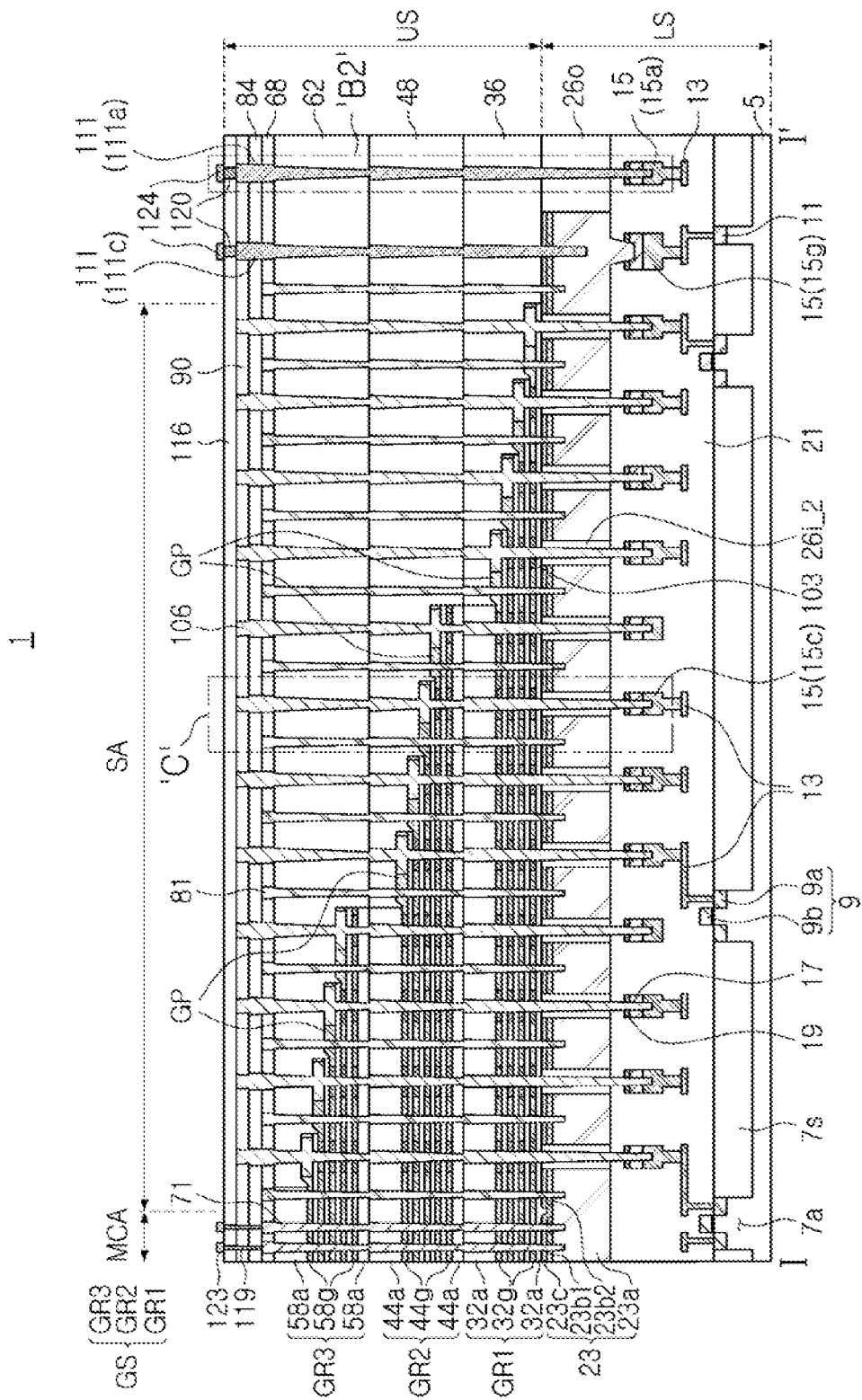
FIGS. 2A and 2B are schematic cross-sectional views of a semiconductor device according to an embodiment of the present inventive concept.

Hereinafter, an example of the semiconductor device 1 will be described with reference to FIGS. 2A and 2B. FIG. 2A is a schematic cross-sectional view taken along line I-I' of FIG. 1, and FIG. 2B is a schematic cross-sectional view taken along line II-IF of FIG. 1.

Figure 2B:
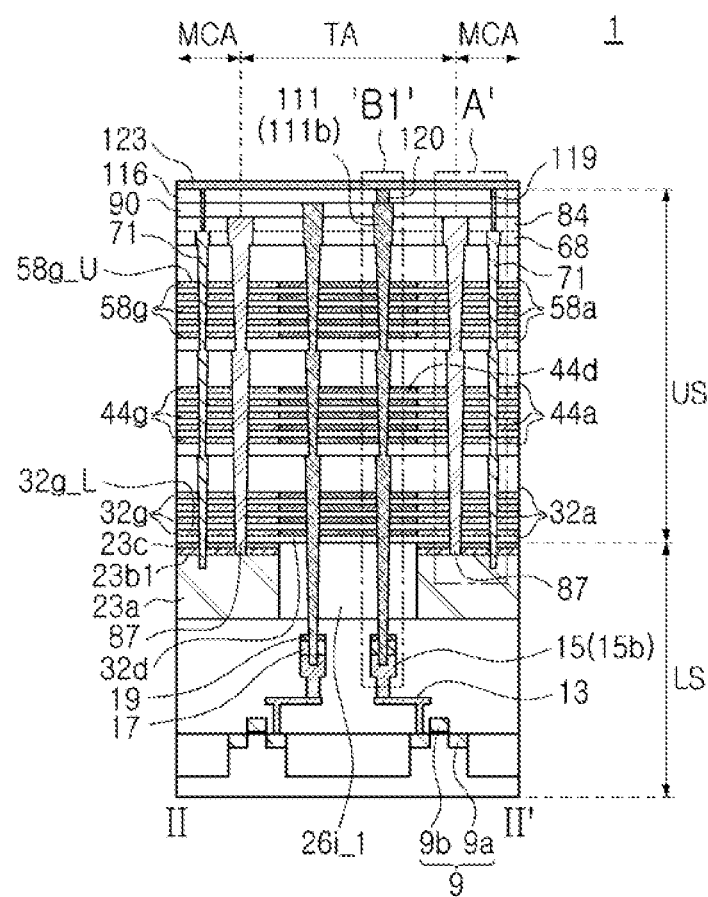

Referring to FIGS. 2A and 2B together with FIG. 1, in an embodiment, the first structure LS of the semiconductor device 1 includes a patterned structure 23. The patterned structure 23 includes at least one silicon layer.

In an embodiment, the patterned structure 23 includes a lower patterned layer 23a, a first intermediate patterned layer 23b1, a second intermediate patterned layer 23b2, and an upper patterned layer 23c. The first intermediate patterned layer 23b1 and the second intermediate patterned layer 23b2 are spaced apart from each other on the first patterned layer 23a. The upper patterned layer 23c covers the first intermediate patterned layer 23b1 and the second intermediate patterned layer 23b2 on the first patterned layer 23a. The first patterned layer 23a has a greater thickness than each of the first intermediate patterned layer 23b1, the second intermediate patterned layer 23b2, and the upper patterned layer 23c. At least one of the first patterned layer 23a, the first intermediate patterned layer 23b1, the second intermediate patterned layer 23b2, and the upper patterned layer 23c includes a silicon layer. For example, the first patterned layer 23a, the first intermediate patterned layer 23b1, and the upper patterned layer 23c may include a silicon layer, e.g., a silicon layer having N-type conductivity, and the second intermediate patterned layer 23b2 may include a material that differs from that of the silicon layer. For example, the second intermediate patterned layer 23b2 may include a plurality of sequentially stacked layers, such as a silicon oxide layer, a silicon nitride layer, and a silicon oxide layer that are sequentially stacked.

In an embodiment, the first structure LS includes a semiconductor substrate 5, peripheral circuits 9 and 13 on the semiconductor substrate 5, peripheral pads 15 that are electrically connected to the peripheral circuits 9 and 13, and a lower insulation structure 21 on the semiconductor substrate 5 and that covers the peripheral circuits 9 and 13 and the peripheral pads 15. The semiconductor substrate 5 includes a device isolation layer 7s that defines an active region 7a. The peripheral circuits 9 and 13 include a circuit element 9, such as a transistor that includes a peripheral gate 9a disposed on the active region 7a, peripheral source/drain 9b disposed in the active region 7a on both sides of the peripheral gate 9a, and a circuit interconnection 13 that is electrically connected to the circuit element 9.

In an embodiment, the first structure LS further includes a capping layer 17 formed on each of the peripheral pads 15 and an etch stop layer 19 formed on the capping layer 17. In an embodiment, the capping layer 17 is formed of a silicon layer, and the etch stop layer 19 is formed of an insulating material, such as silicon oxide or silicon nitride.

In an embodiment, the patterned structure 23 is disposed on the lower insulation structure 21. The peripheral pads 15 include a ground pad 15g, a first peripheral pad 15a, a second peripheral pad 15b, and a third peripheral pad 15c.

In an embodiment, a portion of the first patterned layer 23a of the patterned structure 23 extends downward to be electrically connected to the ground pad 15g. The ground pad 15g is grounded to a ground region 11 of the semiconductor substrate 5 through the circuit interconnection 13.

In an embodiment, the first structure LS further includes an outer insulating layer 26o disposed outside the patterned structure 23, a first inner insulating layer 26i_1 that penetrates through the patterned structure 23, and a second inner insulating layers 26i_2 that penetrates through the patterned structure 23.

In an embodiment, the first inner insulating layer 26i_1 has a line shape in a plan view. Each of the second inner insulating layers 26i_2 may have a circular, oval, or polygonal shape.

In an embodiment, the second structure US of the semiconductor device 1 includes a stack structure GS that is disposed in the first region MCA and that extends from the first region MCA into the second region SA. The stack structure GS includes at least three stack groups GR1, GR2, and GR3 stacked in a vertical direction Z. For example, the stack structure GS includes a lower stack group GR1, an intermediate stack group GR2 on the lower stack group GR1, and an upper stack group GR3 on the intermediate stack group GR2. The lower stack group GR1 includes lower interlayer insulating layers 32a and lower gate layers 32g that are alternately stacked, the intermediate stack group GR2 includes intermediate interlayer insulating layers 44a and intermediate gate layers 44g that are alternately stacked, and the upper stack group GR3 includes upper interlayer insulating layers 58a and upper gate layers 58g that are alternately stacked.

In an embodiment, the lower gate layers 32g are stacked and spaced apart from each other in the vertical direction Z and form a lower gate stack group, the intermediate gate layers 44g are stacked and spaced apart from each other in the vertical direction Z and form an intermediate gate stack group, and the upper gate layers 55g are stacked and spaced apart from each other in the vertical direction Z and form an upper gate stack group. In this regard, the reference labels 32g, 44g and 55g may also be used to refer to, respectively, the lower gate stack group, the intermediate gate stack group, and the upper gate stack group.

In an embodiment, the lower, intermediate, and upper gate layers 32g, 44g, and 58g include gate pads GP at ends thereof and arranged in a step shape in the second region SA. However, the gate pads GP are not limited to the step shape illustrated in FIG. 2A and may be arranged in various other shapes in other embodiments.

In an embodiment, a thickness of each of the gate pads GP is greater than a thickness of each of the lower, intermediate, and upper gate layers 32g, 44g, and 58g.

In an embodiment, the second structure US further includes intermediate insulation structures 36, 48, and 62 that cover at least a portion of the stack structure GS. The intermediate insulation structures 36, 48, and 62 include a first intermediate insulating layer 36 disposed on the lower structure LS and that covers the gate pads GP of the lower gate layers 32g, a second intermediate insulating layer 48 disposed on the first intermediate insulating layer 36 and that covers the gate pads GP of the intermediate gate layers 44g, and a third intermediate insulating layer 62 disposed on the second intermediate insulating layer 48 and that covers the gate pads GP of the upper gate layers 58g.

In an embodiment, the second structure US further includes upper insulation structures 68, 84, 90, and 116 disposed on the stack structure GS and the intermediate insulation structures 36, 48, and 62. The intermediate insulation structures 36, 48, and 62 and the upper insulation structures 68, 84, 90 and 116 form an insulation structure.

In an embodiment, the upper insulation structure 68, 84, 90, and 116 include a first upper insulating layer 68, a second upper insulating layer 84, a third upper insulating layer 90, and a fourth upper insulating layer that are sequentially stacked.

In an embodiment, the semiconductor device 1 further includes a vertical memory structure 71 that penetrates through at least the stack structure GS in the first region MCA. A plurality of vertical memory structures 71 are provided. The vertical memory structure 71 extends downward and penetrates through the stack structure GS and extends into the patterned structure 23. For example, the vertical memory structure 71 extends through the upper patterned layer 23c and the first intermediate patterned layer 23b1 and into the lower patterned layer 23a to be in contact with the lower patterned layer 23a. The vertical memory structure 71 extends upward from the stack structure GS and penetrates through the first upper insulating layer 68. An upper surface of the vertical memory structure 71 is coplanar with an upper surface of the first upper insulating layer 68.

In an embodiment, the semiconductor device 1 further includes a support vertical structure 81 that penetrates through at least the stack structure GS in the second region SA. A plurality of support vertical structure 81 are provided. The support vertical structure 81 extends into the patterned structure 23. For example, the support vertical structure 81 sequentially extends through the upper patterned layer 23c and the second intermediate patterned layer 23b2 into the lower patterned layer 23a to be in contact with the lower patterned layer 23a. The support vertical structure 81 extends upward from the stack structure GS to penetrate through the first upper insulating layer 68. An upper surface of the vertical support structure 81 is coplanar with an upper surface of the first upper insulating layer 68.

In an embodiment, the separation structure 87 described above with reference to FIG. 1 penetrates through at least the stack structure GS. The separation structure 87 extends downward from the stack structure GS to be in contact with the lower patterned layer 23a of the patterned structure 23. The separation structure 87 extends upward from the stack structure GS to penetrate through the first and second upper insulating layers 68 and 84. An upper surface of the separation structure 87 is coplanar with an upper surface of the second upper insulating layer 84.

In an embodiment, the through region TA described above with reference to FIG. 1 is located on the first inner insulating layer 26i_1. The through region TA includes lower, intermediate, and upper horizontal insulating layers 32d, 44d, and 58d positioned at substantially the same height level as the lower, intermediate, and upper gate layers 32g, 44g, and 58g. In the through region TA, the lower, intermediate, and upper interlayer insulating layers 32a, 44a, 58a and the lower, intermediate and upper horizontal insulating layers 32d, 44d, and 58d are alternately and repeatedly stacked. The lower, intermediate, and upper horizontal insulating layers 32d, 44d, and 58d are formed of silicon nitride, and the lower, intermediate, and upper interlayer insulating layers 32a, 44a, and 58a are formed of silicon oxide.

In an embodiment, the peripheral contact plugs 111 penetrate through at least a portion of the second structure US. The peripheral contact plugs 111 include a first peripheral contact plug 111a, a second peripheral contact plug 111b, and a third peripheral contact plug 111c.

In an embodiment, the first peripheral contact plug 111a is spaced apart from the stack structure GS, penetrates through the intermediate insulation structures 36, 48, and 62, the outer insulating layer 26o, and the first, second, and the third upper insulating layers 68, 84, and 90, and is in contact with the first peripheral pad 15a. An upper surface of the first peripheral contact plug 111a is coplanar with an upper surface of the third upper insulating layer 90.

In an embodiment, the second peripheral contact plug 111b penetrates through the lower, intermediate and upper interlayer insulating layers 32a, 44a, and 58a, and the lower, intermediate, and upper horizontal insulating layers 32d, 44d, and 58d in the through region TA, penetrates through the first inner insulating layer 26i_1 and the first, second, and third upper insulating layers 68, 84, and 90, and is in contact with the second peripheral pad 15b. An upper surface of the second peripheral contact plug 111b is coplanar with an upper surface of the third upper insulating layer 90.

In an embodiment, the third peripheral contact plug 111c is spaced apart from the stack structure GS, penetrates through the intermediate insulation structures 36, 48, and 62 and the first, second, and third upper insulating layers 68, 84 and 90, and is in contact with the lower patterned layer 23a. An upper surface of the third peripheral contact plug 111c is coplanar with an upper surface of the third upper insulating layer 90.

In an embodiment, lower surfaces of the peripheral contact plugs 111 are located at a lower level than a lower surface of the vertical memory structure 71, and upper surfaces of the peripheral contact plugs 111 are located at a higher level than an upper surface of the vertical memory structure 71.

In an embodiment, the semiconductor device 1 further includes gate contact plugs 106 that penetrate through at least a portion of the second structure US and electrically connect to the gate layers 32g, 44g, and 58g. Each of the gate contact plugs 106 has a lower surface at a lower level than the lowermost gate layer 32g_L of the gate layers 32g, 44g, and 58g, and an upper surface at a level higher than the uppermost gate layer 58g_U of the gate layers 32g, 44g, and 58g.

In an embodiment, the gate contact plugs 106 are in contact with the gate pads GP, respectively. The gate contact plugs 106 extend through the gate pads GP, respectively. For example, one gate contact plug 106 is electrically connected to and extends through one gate pad GP. Buffer insulating layers 103 are disposed between those gate layers that are positioned at a lower level than the gate pads GP and the gate contact plugs 106. For example, based on one gate pad GP and one gate contact plug 106 in contact with each other, the buffer insulating layers 103 is disposed between the gate layers that are positioned lower than the gate pads GP and the gate contact plugs 106. The buffer insulating layers 103 are formed of silicon oxide.

In an embodiment, the gate contact plugs 106 have a lower surface at a lower level than the lowermost gate layer 38g_L and an upper surface at a higher level than the uppermost gate layer 58g_U. Lower surfaces of the gate contact plugs 106 are located at a lower level than a lower surface of the vertical memory structure 71, and upper surfaces of the gate contact plugs 106 are located at a higher level than an upper surface of the vertical memory structure 71.

In an embodiment, the semiconductor device 1 includes a bit line contact plug 119 that penetrate through the upper insulation structure 68, 84, 90, and 116 and electrically connect to the vertical memory structure 71, and upper contact plugs 120 that penetrate through the fourth upper insulating layer 116 and electrically connect to the peripheral contact plugs 111.

In an embodiment, the semiconductor device 1 further includes a bit line 123 on the fourth upper insulating layer 116 and that is electrically connected to the vertical memory structure 71 through the bit line contact plug 119, and a peripheral interconnection 124 on the fourth upper insulating layer 116 and that is electrically connected to the first and third peripheral contact plugs 111a and 111c respectively through the upper contact plugs 120. The second peripheral contact plug 111b are electrically connected to the bit line 123 through one of the upper contact plugs 120.

Figure 3A:
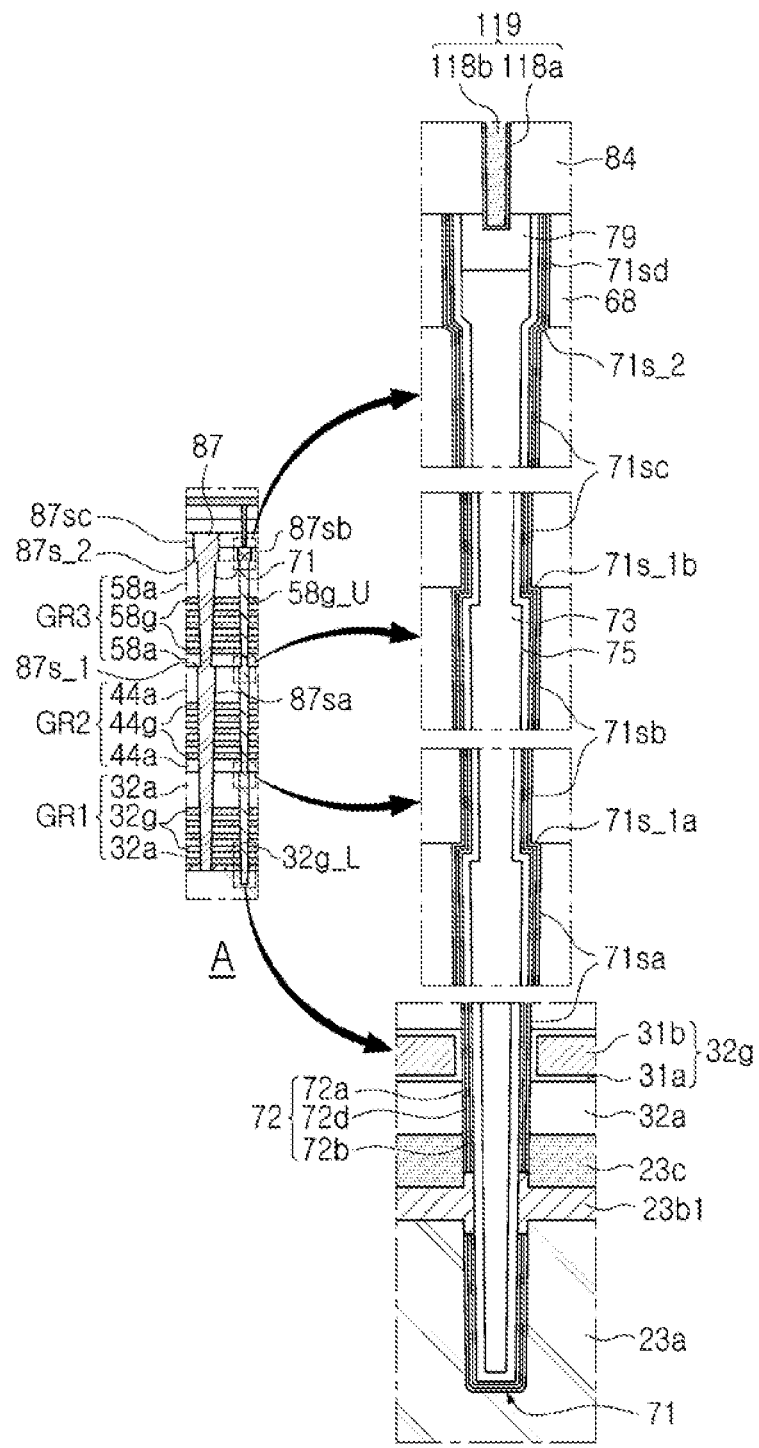
FIGS. 3A to 3C are schematic partially enlarged views of a portion of a semiconductor device according to an embodiment of the present inventive concept.

Hereinafter, the vertical memory structure 71 and the separation structure 87 disclosed above will be described with reference to FIG. 3A. FIG. 3A is a partially enlarged view of a region "A" in FIG. 2B.

Referring to FIG. 3A in conjunction with FIGS. 1 through 2B, in an embodiment, a side surface of the vertical memory structure 71, at a height level between the lowermost gate layer 32g_L and the uppermost gate layer 58g_U, includes a plurality "N" of memory side surface slope changing portions 71s_1a and 71s_1b. A side surface of the separation structure 87 includes a plurality "M" of separation side surface slope changing portions 87s_1 positioned at substantially the same height level as "M" of the slope changing portions 71s_1b, where "M"<N.

Here, "N" is a natural number of 2 or greater, and "M" is a natural number less than N, for example, a natural number of 1 or greater. For example, "M" may be N−1. For example, "N" may be 2 and "M" may be 1.

In an embodiment, M separation side surface slope changing portions 87s_1 are located at substantially the same height level as the memory side surface slope changing portion 71s_1b that are positioned higher than the lowermost memory side surface slope changing portion 71s_1a, of the "N" memory side surface slope changing portions 71s_1a and 71s_1b.

In an embodiment, at a higher level than the uppermost gate layer 58g_U, the vertical memory structure 71 includes at least one upper side surface slope changing portion 71s_2.

In an embodiment, at a higher level than the uppermost gate layer 58g_U, the separation structure 87 includes at least one upper side surface slope changing portion 87s_2. The upper side surface slope changing portion 71s_2 of the vertical memory structure 71 and the upper side surface slope changing portion 87s_2 of the separation structure 87 are located at substantially the same height level.

In embodiments, the "slope changing portion" refers to a side surface portion that has a third slope between an upper side surface portion of a first slope and a lower side surface of a second slope, defined as follows. Each of the first slope and the second slope is a vertical or near-vertical slope, and the third slope is gentler or less steep than each of the first slope and the second slope. Each of the first slope and the second slope is a steep slope, and the third slope is a gentle slope or a less steep slope. For example, the side surface of the vertical memory structure 71 includes a lower side surface portion 71sa that has a steep slope, a first intermediate side surface portion 71sb above the lower side surface portion 71sa and that has a steep slope, a first memory side surface slope changing portion 71s_1a between the lower side surface portion 71sa and the first intermediate side surface portion 71sb and that has a gentle slope, a second intermediate side surface portion 71sc above the first intermediate side surface portion 71sb and that has a steep slope, a second memory side surface slope changing portion 71s_1b between the first intermediate side surface portion 71sb and the second intermediate side surface portion 71sc and that has a gentle slope, an upper side surface portion 71sd above the second intermediate side surface portion 71sc and that has a steep slope, and an upper side surface slope changing portion 71s_2 between the second intermediate side surface portion 71sc and the upper side surface portion 71sd and that has a gentle slope. Here, "steep slope" and "gentle slope" are terms indicating relative slopes, where gentle slopes are less steep than steep slopes, steep slopes in different side portions have different slopes, and gentle slopes on different slope changing portions have different slopes.

In embodiments, the side surface of the separation structure 87 includes a lower side surface portion 87sa that has a steep slope, an intermediate side surface portion 87sb above the lower side surface portion 87sa and that has a steep slope, a separation side surface slope changing portion 87s_1 between the lower side surface portion 87sa and the intermediate side surface portion 87sb and that has a gentler or less steep slope, an upper side surface portion 87sc above the intermediate side surface portion 87sb and that has a steep slope, and an upper slope changing portion 87s_2 between the intermediate side surface portion 87sb and the upper side surface portion 87sc and that has a gentler or less steep slope.

Therefore, in embodiments, even without a separate description below, the "side surface slope changing portion" or "slope changing portion" are portions positioned between the steep slope of the upper side surface portion positioned at an upper portion of the side surface slope changing portion and a steep slope of the lower side surface portion positioned at a lower portion of the side surface slope changing portion and that have a gentle slope.

In embodiments, in the terms "memory side surface slope changing portions" and the "separation side surface slope changing portion," the terms "memory side surface" and the "separation side surface" are for distinguishably describing slope changing portions of different components and may be replaced by other terms. For example, the "memory side surface slope changing portions" and the "separation side surface slope changing portion" may be replaced with and described as "first slope changing portions" and "second slope changing portion," respectively, or may be replaced with and described as "first side surface slope changing portions" and "second side surface slope changing portion," respectively.

In embodiments, at a height level between the lowermost gate layer 32g_L and the uppermost gate layer 58g_U, the "N" memory side surface slope changing portions 71s_1a and 71s_1b of the vertical memory structure 71 are located between the at least three adjacent gate stack groups in the vertical direction. For example, the first memory side surface slope changing portion 71s_1a of the "N" memory side surface slope changing portions 71s_1a and 71s_1b is located at a height level between the lower gate stack group 32g and the intermediate gate stack group 44g, and the second memory side surface slope changing portion 71s_1b is located at a height level between the intermediate gate stack group 44g and the upper gate stack group 58g.

In embodiments, the side surface of the separation structure 87 is substantially vertical at the same height level as the lowermost memory side surface slope changing portion 71s_1a.

In embodiments, each of the lower gate layers 32g includes a first layer 31a and a second layer 31b. The first layer 31a covers upper and lower surfaces of the second layer 31b and extends between the vertical memory structure 71 and the second layer 31b. In addition, each of the intermediate and upper gate layers 44g and 55g also includes a first layer and a second layer with substantially similar structures.

In an embodiment, the first layer 31a includes a dielectric material, and the second layer 31b includes a conductive material. For example, the first layer 31a includes a high-k dielectric such as AlO, and the second layer 31b includes a conductive material such as TiN, WN, Ti or W.

In an embodiment, the first layer 31a includes a first conductive material, such as TiN or W, etc., and the second layer 31b includes a second conductive material, such as Ti or W, etc., that differs from the first conductive material.

In an embodiment, each of the lower, intermediate, and upper gate layers 32g, 44g, and 58g is formed of at least one of a doped polysilicon, a metal-semiconductor compound, such as TiSi, TaSi, CoSi, NiSi, or WSi, a metal nitride, such as TiN, TaN, or WN, or a metal, such as Ti or W.

In an embodiment, the vertical memory structure 71 includes a gap-filling insulating layer 73, a channel material layer 75 that covers an outer surface and a bottom surface of the gap-filling insulating layer 73, a data storage structure 72 that covers an outer surface and a bottom surface of the channel material layer 73, and a pad pattern 79 on the gap-filling insulating layer 73.

In an embodiment the data storage structure 72 includes a first dielectric layer 72b that covers an outer surface and a bottom surface of the channel material layer 75, a data storage layer 72d that covers an outer surface and a bottom surface of the first dielectric layer 72b, and a second dielectric layer 72a that covers an outer surface and a bottom surface of the data storage layer 72d. The first dielectric layer 72b is in contact with the channel material layer 73, and the data storage layer 72d is spaced apart from the channel material layer 73.

In an embodiment, the gap-filling insulating layer 73 includes silicon oxide, such as atomic layer deposition (ALD) silicon oxide that is formed by an ALD process, or silicon oxide in which voids are formed.

In an embodiment, the first dielectric layer 72b includes silicon oxide or silicon oxide doped with impurities. The second dielectric layer 72a includes at least one of silicon oxide or a high-k dielectric. The data storage layer 72d includes a material that traps a charge, such as silicon nitride.

In an embodiment, the data storage layer 72d includes regions that store data in a semiconductor device such as a flash memory device. The channel material layer 73 includes polysilicon. The pad pattern 79 includes at least one of doped polysilicon, a metal nitride, such as TiN, etc., a metal, such as W, etc., or a metal-semiconductor compound, such as TiSi, etc.

In an embodiment, the first intermediate patterned layer 23b1 of the patterned structure 23 penetrates through the data storage structure 72 of the vertical memory structure 71 to be in contact with the channel material layer 73.

In an embodiment, the bit line contact plug 119 includes a plug pattern 118b and a conductive liner 118a that covers a side surface and a bottom surface of the plug pattern 118b.

Figure 3B:
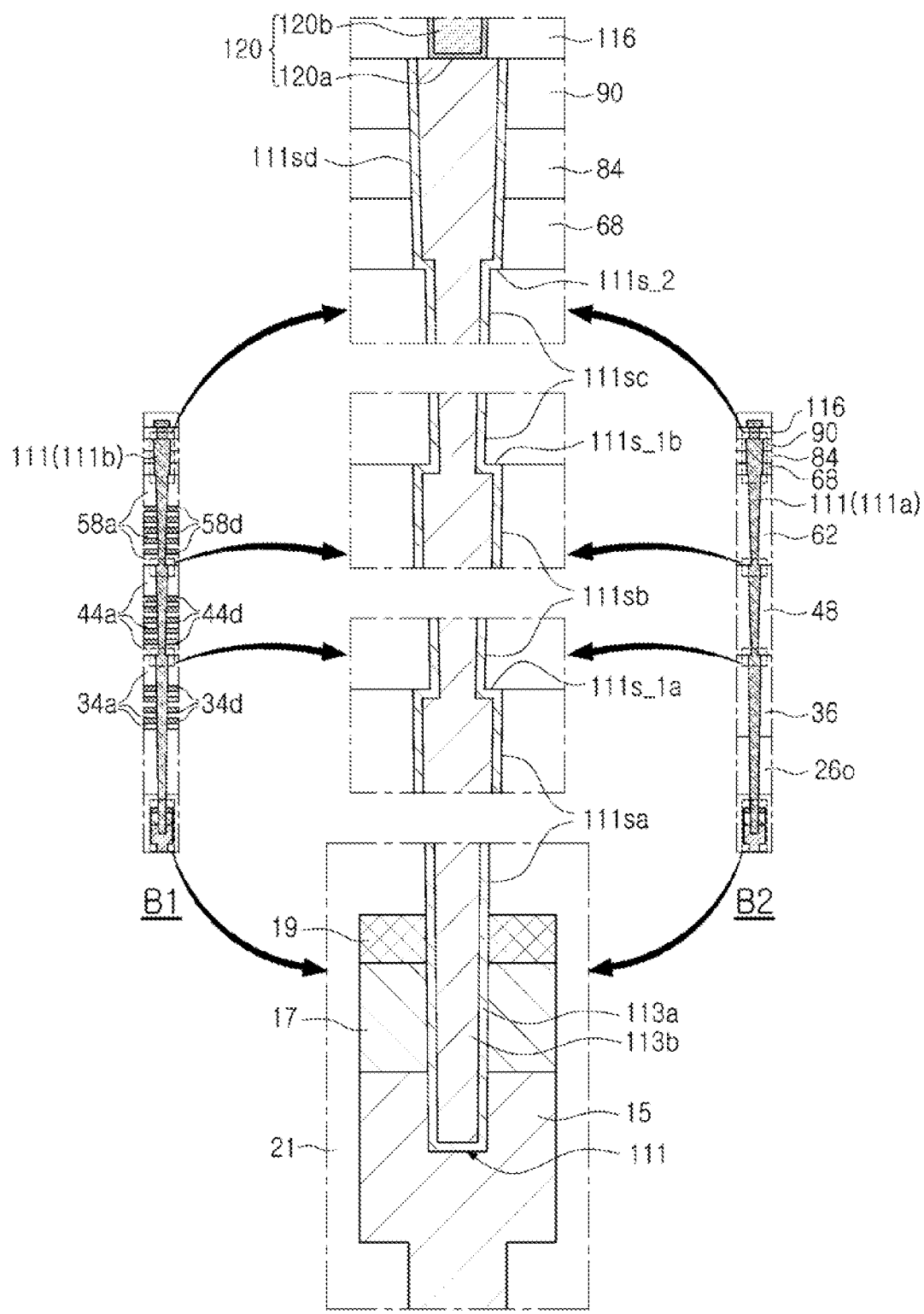

Next, the peripheral contact plugs 111 disclosed above will be described with reference to FIG. 3B. FIG. 3B is an enlarged partial view of regions B1 of FIGS. 2B and B2 of FIG. 2A. Hereinafter, the peripheral contact plug 111 of one of the first and second peripheral contact plugs 111a and 111b will be described.

Referring to FIG. 3B together with FIGS. 1 to 3A, in an embodiment, at a height level between the lowermost gate layer 32g_L and the uppermost gate layer 58g_U, like the side surface of the vertical memory structure 71, a side surface of the peripheral contact plug 111 includes a plurality "N" of peripheral contact side surface slope changing portions 111s_1a and 111s_1b disposed at substantially the same height level as the plurality "N" of memory side surface slope changing portions 71s_1a and 71s_1b. At a higher level than the uppermost gate layer 58g_U, the peripheral contact plug 111 includes at least one upper side surface slope changing portion 111s_2. The upper side surface slope changing portion 71s_2 of the vertical memory structure 71 and the upper side surface slope changing portion 111s_2 of the peripheral contact plug 111 are disposed at substantially the same height level.

In an embodiment, the side surface of the peripheral contact plug 111 includes a lower side surface portion 111sa, a first intermediate side surface portion 111sb above the lower side surface portion 111sa, a first peripheral contact side surface slope changing portion 111s_1a between the lower side surface portion 111sa and the first intermediate side surface portion 111sb and that has a slope gentler or less steep than a slope of each of the lower side surface portion 111sa and the first intermediate side surface portion 111sb, a second intermediate side surface portion 111sc above the first intermediate side surface portion 111sb, a second peripheral contact side surface slope changing portion 111s_1b between the first intermediate side surface portion 111sb and the second intermediate side surface portion 111sc and that has a slope gentler or less steep than the slope of each of the first intermediate side surface portion 111sb and the second intermediate side surface portion 111sc, an upper side surface portion 111sd above the second intermediate side surface portion 111sc, and an upper side surface slope changing portion 111s_2 between the second intermediate side surface portion 111sc and the upper side surface portion 111sd and that has a slope gentler or less steep than a slope of each of the second intermediate side surface portion 111sc and the upper side surface portion 111sd.

In an embodiment, the peripheral contact plug 111 includes a plug pattern 113b and a conductive liner 113a that covers a side surface and a bottom surface of the plug pattern 113b. The plug pattern 113b includes a conductive material such as tungsten, and the conductive liner 113a includes a conductive material such as Ti or TiN. However, embodiments are not limited thereto, and in other embodiments, the conductive material may be replaced with various materials other than the disclosed materials.

In an embodiment, the upper contact plug 120 includes a plug pattern 120b and a conductive liner 120a that covers a side surface and a bottom surface of the plug pattern 120b.

Figure 3C:
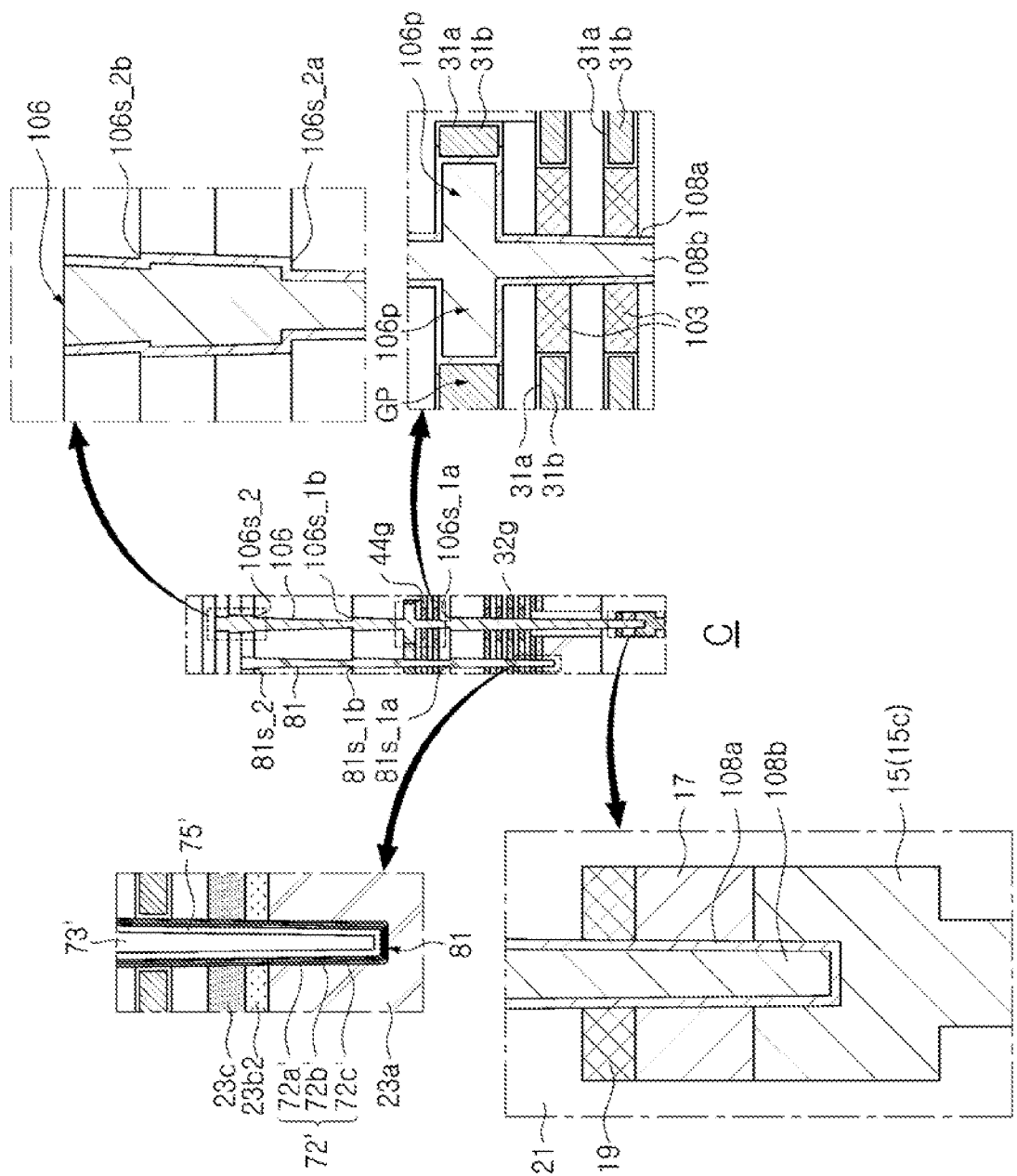

Next, the gate contact plugs 106 and the support vertical structure 81 disclosed above will be described with reference to FIG. 3C. FIG. 3C is a partially enlarged view of a region "C" in FIG. 2A. Hereinafter, one of the gate contact plugs 106 will be described.

Referring to FIG. 3C along with FIGS. 1 to 3B, at the height level between the lowermost gate layer 32g_L and the uppermost gate layer 58g_U, like the side surface of the vertical memory structure 71, a side surface of the gate contact plug 106 includes a plurality "N" of gate contact side surface slope changing portions 106s_1a and 106s_1b disposed at substantially the same height level as the plurality "N" of memory side surface slope changing portions 71s_1a and 71s_1b. At a level higher than the uppermost gate layer 58g_U, the gate contact plug 106 includes at least two upper side surface slope changing portions 106s_2a and 106s_2b.

In an embodiment, the first upper side surface slope changing portion 106s_2a positioned at a lower portion of the at least two upper side surface slope changing portions 106s_2a and 106s_2b of the gate contact plug 106 is located at substantially the same height level as the upper side surface slope changing portion 71s_2 of the vertical memory structure 71.

In an embodiment, the second upper side surface slope changing portion 106s_2b positioned at an upper portion of the at least two upper side surface slope changing portions 106s_2a and 106s_2b of the gate contact plug 106 is located at a higher level than an upper surface of the vertical memory structure 71.

In an embodiment, the gate contact plug 106 includes a plug pattern 108b and a conductive liner 108a that covers a side surface and a bottom surface of the plug pattern 108b. The plug pattern 108b includes a conductive material such as tungsten, and the conductive liner 108a includes a conductive material such as Ti or TiN.

In an embodiment, the gate contact plug 106 includes a horizontal extension portion 106p that extends in a horizontal direction from a vertical portion in contact with the gate pad GP. When the gate layers are positioned at a lower level than the gate pad GP in contact with the gate contact plug 106, as described above, the buffer insulating layers 103 are positioned between the gate layers at a lower level than the gate pad GP and the gate contact plug 106 and overlap the horizontal extension portion 106p.

In an embodiment, like the side surface of the vertical memory structure 71, at a height level between the lowermost gate layer 32g_L and the uppermost gate layer 58g_U, a side surface of the support vertical structure 81 includes a plurality "N" of support side surface slope changing portions 87s_1a and 87s_1b positioned at substantially the same height level as the plurality "N" of memory side surface slope changing portions 71s_1a and 71s_1b. At a higher level than the uppermost gate layer 58g_U, the support vertical structure 81 includes an upper side surface slope changing portion 81s_2 positioned at substantially the same height level as the upper side surface slope changing portion 71s_2 of the vertical memory structure 71.

In an embodiment, the support vertical structure 81 is formed of substantially the same material layers as the vertical memory structure 71. For example, the support vertical structure 81 includes a gap-filling insulating layer 73', a channel material layer 75' that covers an outer surface and a bottom surface of the gap-filling insulating layer 73', and a data storage structure 72' that covers an outer surface and a bottom surface of the channel material layer 75'. The data storage structure 72' includes a first dielectric layer 72b' that covers an outer surface and a bottom surface of the channel material layer 75', a data storage layer 72d' that covers an outer surface and a bottom surface of the first dielectric layer 72b', and a second dielectric layer 72a' that covers an outer surface and a bottom surface of the data storage layer 72d'.

As described above, in an embodiment, at a higher level than the uppermost gate layer 58g_U, the side surface of the vertical memory structure 71, the side surface of each of the peripheral contact plugs 111, and the side surface of the support vertical structure 81, and the side surface of each of the gate contact plugs 106 includes first upper slope changing portions 71s_2, 81s_2, 111s_2, and 106s_2a disposed at substantially the same height level, and each of the side surfaces of the gate contact plugs 106 includes a second upper slope changing portion 106s_2b disposed at a higher level than the first upper slope changing portion 71s_2, 81s_2, 111s_2, and 106s_2a.

Figure 4A:
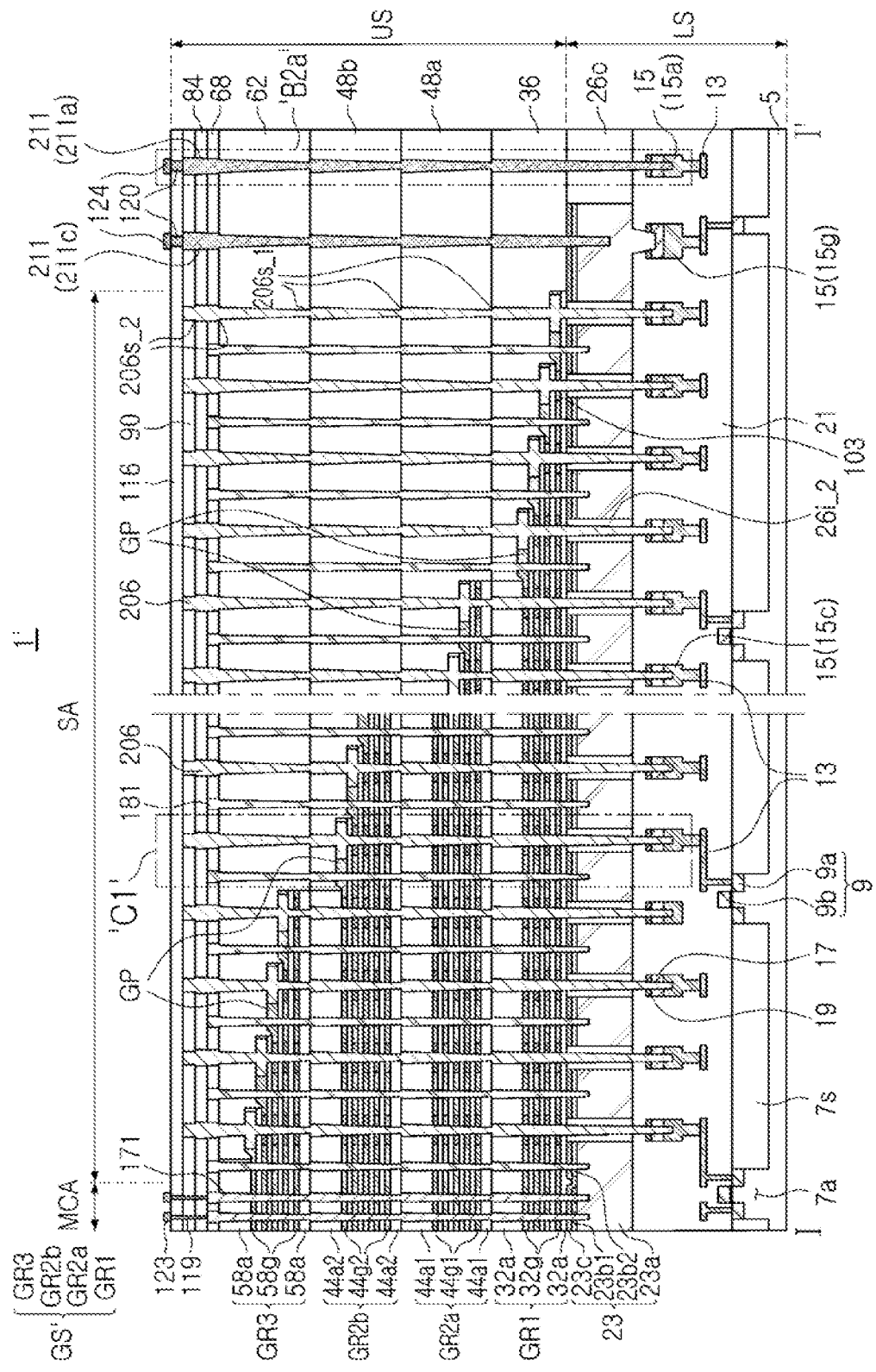
FIGS. 4A and 4B are schematic cross-sectional views of a semiconductor device according to a modified embodiment of the present inventive concept.
Figure 4B:
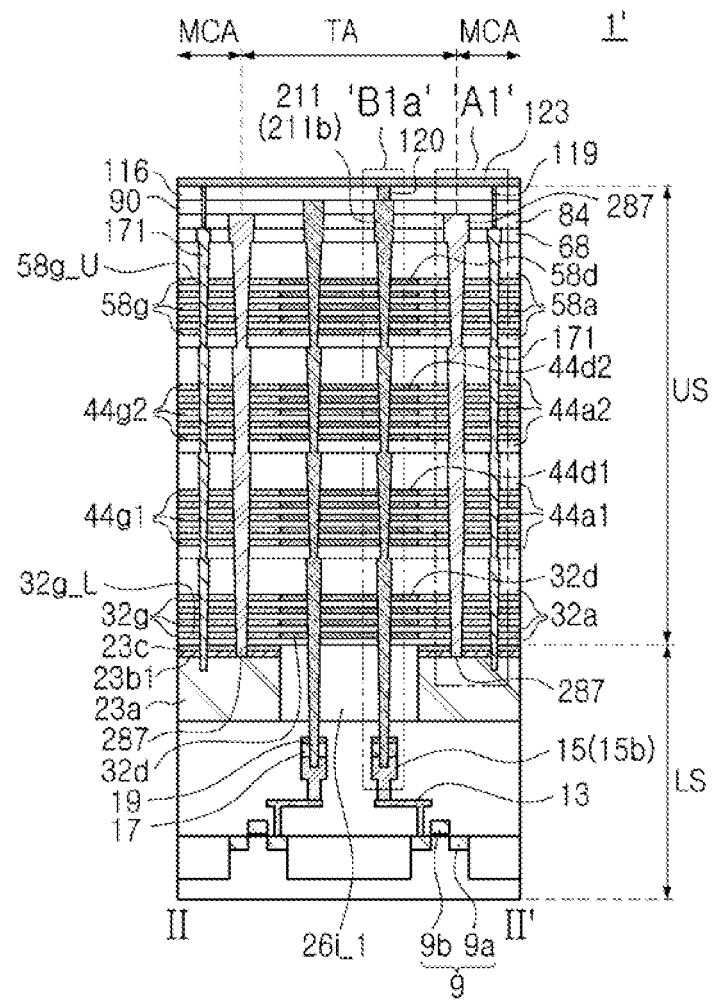

Next, a semiconductor device according to a modified embodiment of the present inventive concept will be described with reference to FIGS. 4A and 4B. FIG. 4A is a schematic cross-sectional view taken along line I-I' of FIG. 1, and FIG. 4B is a schematic cross-sectional view taken along line II-IF of FIG. 1. In a description of a semiconductor device according to a modified embodiment of the present inventive concept with reference to FIGS. 4A and 4B, the components of the components of the semiconductor device 1 described above that are modified or replaced will be described, and descriptions of components that are substantially the same as the components described above, components that may be easily understood from the components described above, or components that may be easily understood from the drawings described above, will be omitted.

Referring to FIGS. 4A and 4B, in an embodiment, the semiconductor device 1' includes a first structure LS and a second structure US disposed on the first structure LS. The stack structure GS that includes the at least three stack groups GR1, GR2, and GR3 described above with reference to FIGS. 2A and 2B is replaced with a stack structure GS' that includes at least four stack groups GR1, GR2a, GR2b and GR3.

In an embodiment, the four stack groups GR1, GR2a, GR2b, and GR3 include a lower stack group GR1, a first intermediate stack group GR2a disposed on the lower stack group GR1, a second intermediate stack group GR2b disposed on the first intermediate stack group GR2a, and an upper stack group GR3 disposed on the second intermediate stack group GR2b. The lower stack group GR1 includes lower interlayer insulating layers 32a and lower gate layers 32g that are alternately stacked, the first intermediate stack group GR2a includes first intermediate interlayer insulating layers 44a1 and first intermediate gate layers 44g1 that are alternately stacked, the second intermediate stack group GR2b includes second intermediate interlayer insulating layers 44a2 and second intermediate gate layers 44g2 that are alternately stacked, and the upper stack group GR3 includes upper interlayer insulating layers 58a and upper gate layers 58g that are alternately stacked.

In embodiments, the lower gate layers 32g are stacked and spaced apart from each other and from a lower gate stack group, the first intermediate gate layers 44g1 are stacked and spaced apart from each other and form a first intermediate gate stack group, the second intermediate gate layers 44g2 are stacked and spaced apart from each other and form a second intermediate gate stack group, and the upper gate layers 55g are stacked and spaced apart from each other and form an upper gate stack group. In this regard, the reference labels 32g, 44g1, 44g2 and 55g may also be used to refer to, respectively, the lower gate stack group, the first intermediate gate stack group, the second intermediate gate stack group, and the upper gate stack group.

In embodiments, the terms "lower, first intermediate, second intermediate, and upper" are used to distinguish gate stack groups from each other, and may be replaced by other terms. For example, the terms "lower, first intermediate, second intermediate and upper" may be replaced by the terms "first, second, third and fourth", respectively.

Similar to an embodiment described above with reference to FIGS. 1 to 2B, the lower, first intermediate, second intermediate, and upper gate layers 32g, 44g1, 44g2, and 58g include gate pads GP at ends thereof and arranged in a step shape in the second region SA.

In embodiments, the second structure US further includes intermediate insulation structures 36, 48a, 48b, and 62 that cover at least a portion of the stack structure GS'. The intermediate insulation structures 36, 48a, 48b and 62 include a first intermediate insulating layer 36 that covers the gate pads GP of the lower gate layers 32g on the lower structure LS, a second intermediate insulating layer 48a that covers the gate pads GP of the first intermediate gate layers 44g1 on the first intermediate insulating layer 36, a third intermediate insulating layer 48b that covers the gate pads GP of the second intermediate gate layers 44g2 on the second intermediate insulating layer 48a, and a fourth intermediate insulating layer 62 that covers the gate pads GP of the upper gate layers 58g on the third intermediate insulating layer 48b.

In embodiments, the second structure US further includes upper insulation structures 68, 84, 90, and 116 that include the first to fourth upper insulating layers 68, 84, 90, and 116 substantially identical to those described above with reference to FIGS. 2A and 2B.

In embodiments, the through region TA described above with reference to FIG. 1 includes lower, first intermediate, second intermediate, and upper horizontal insulating layers 32d, 44d1, 44d2, and 58d positioned at substantially the same height level as the lower, first intermediate, second intermediate, and upper gate layers 32g, 44g1, 44g2, and 58g, respectively.

In embodiments, the semiconductor device 1' further includes a vertical memory structure 171 that penetrates through at least the stack structure GS' in the first region MCA, a support vertical structure 181 that penetrates through the stack structure GS' in the second region SA, and a separation structure 287 that penetrates through at least the stack structure GS'. The semiconductor device 1' further includes peripheral contact plugs 211 that include a first peripheral contact plug 211a, a second peripheral contact plug 211b, and a third peripheral contact plug 211c.

Figure 5A:
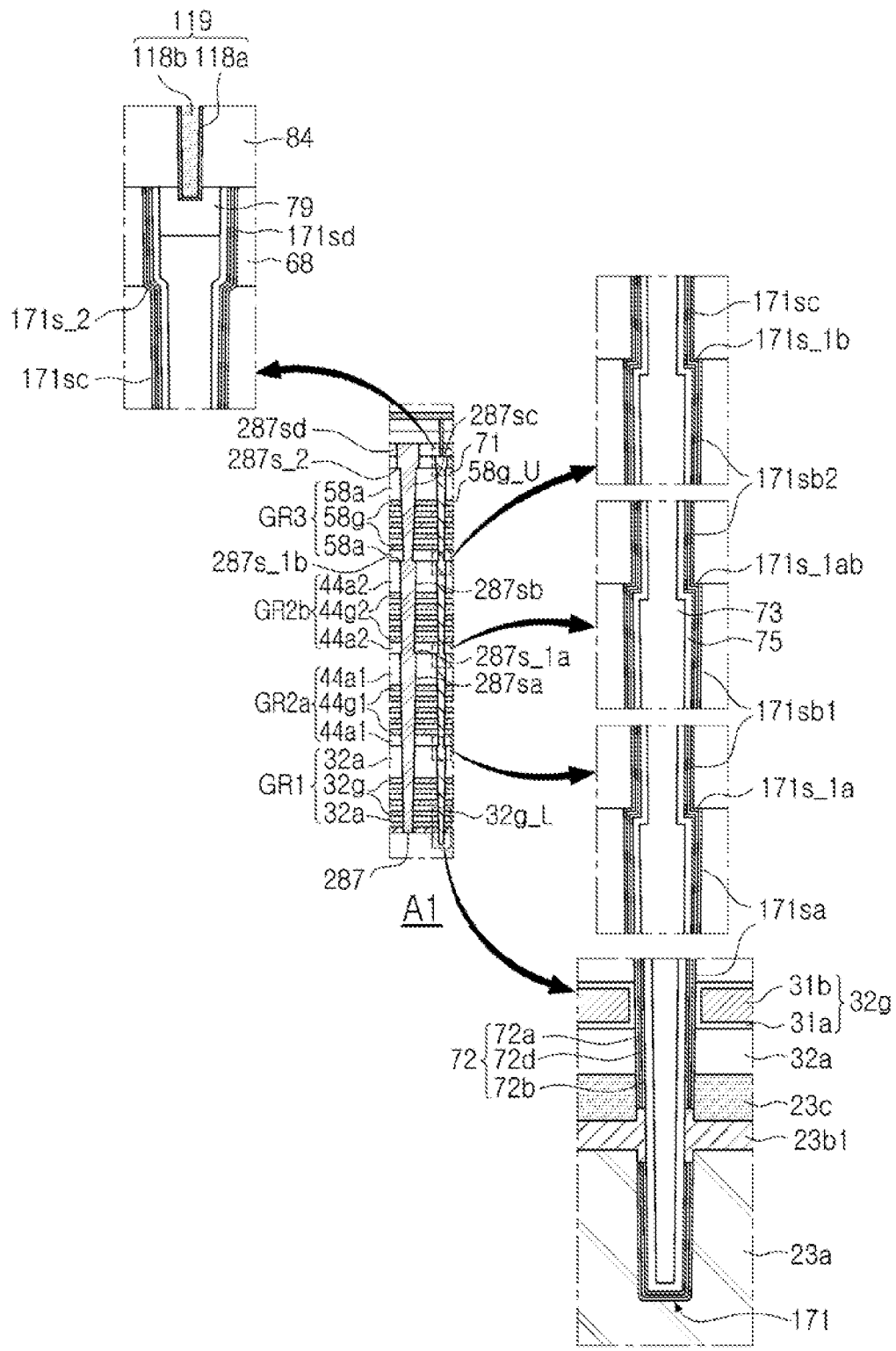
FIGS. 5A and 5B are schematic partially enlarged views of a portion of a semiconductor device according to a modified embodiment of the present inventive concept.

Hereinafter, the vertical memory structure 171 and the separation structure 287 disclosed above will be described with reference to FIG. 5A. FIG. 5A is a partially enlarged view of a region "A1" of FIG. 4B.

Referring to FIG. 5A together with FIGS. 4A and 4B, a side surface of the vertical memory structure 171 includes side surface portions 171sa, 171sb1, 171sb2, 171sc, and 171sd that each have a steep slope, and side surface slope changing portions located between adjacent side surface portions 171sa, 171sb1, 171sb2, 171sc, and 171sd and that have a relatively gentle slope. On a side surface of the vertical memory structure 171, the side surface slope changing portions may include a plurality "N" of memory side surface slope changing portions 171s_1a, 171s_1ab, and 171s_1b disposed at a height level between the lowermost gate layer 32g_L and the uppermost gate layer 58g_L, and at least one upper side surface slope changing portion 171s_2 disposed at a higher level than the uppermost gate layer 58g_U.

In embodiments, a side surface of the separation structure 287 includes side surface portions 287sa, 287sb, 287sc, and 287sd that each has a steep slope, and side surface slope changing portions located between adjacent side surface portions 287*sa*, 287*sb*, 287*sc*, and 287*sd* and that have a relatively gentle slope. On a side surface of the separation structure 287, the side surface slope changing portions include a plurality "M" of separation side surface slope changing portions 287*s*_1*a* and 287*s*_1*b* located at a height level between the lowermost gate layer 32*g*_L and the uppermost gate layer 58*g*_U, and at least one upper side surface slope changing portion 287*s*_2 located on a level higher than the uppermost gate layer 58*g*_U. The upper side surface slope changing portion 171*s*_2 of the side surface of the vertical memory structure 171 and the upper side surface slope changing portion 287*s*_2 of the side surface of the separation structure 287 are positioned at substantially the same height level.

In embodiments, the plurality "M" of separation side surface slope changing portions 287*s*_1*a* and 287*s*_1*b* of the side surface of the separation structure 287 located at a height level between the lowermost gate layer 32*g*_L and the uppermost gate layer 58*g*_U are located at substantially the same height level as the plurality "M" (M<N) of memory side surface slope changing portions 171*s*_1*ab* and 171*s*_1*b* of the "N" memory side surface slope changing portions 171*s*_1*a*, 171*s*_1*ab*, and 171*s*_1*b*. For example, of the "N" memory side surface slope changing portions 171*s*_1*a*, 171*s*_1*ab*, and 171*s*_1*b*, the "M" memory side surface slope changing portions 171*s*_1*ab* and 171*s*_1*b*, where "M"<"N", are located at substantially the same height level. For example, the "M" separation side surface slope changing portions 287*s*_1*a* and 287*s*_1*b* are located at substantially the same height level as the "M" memory side surface slope changing portions 171*s*_1*ab* and 171*s*_1*b* that are located at a higher level than the side surface slope changing portion 171*s*_1*a* positioned on the lowermost portion of the "N" memory side surface slope changing portions 171*s*_1*a*, 171*s*_1*ab*, and 171*s*_1*b*.

"N" and "M" are each a natural number, and "N" is greater than "M". For example, "N" is a natural number of 3 or greater, and "M" is "N–1." For example, "N" may be 3, and "M" may be 2.

Figure 5B:
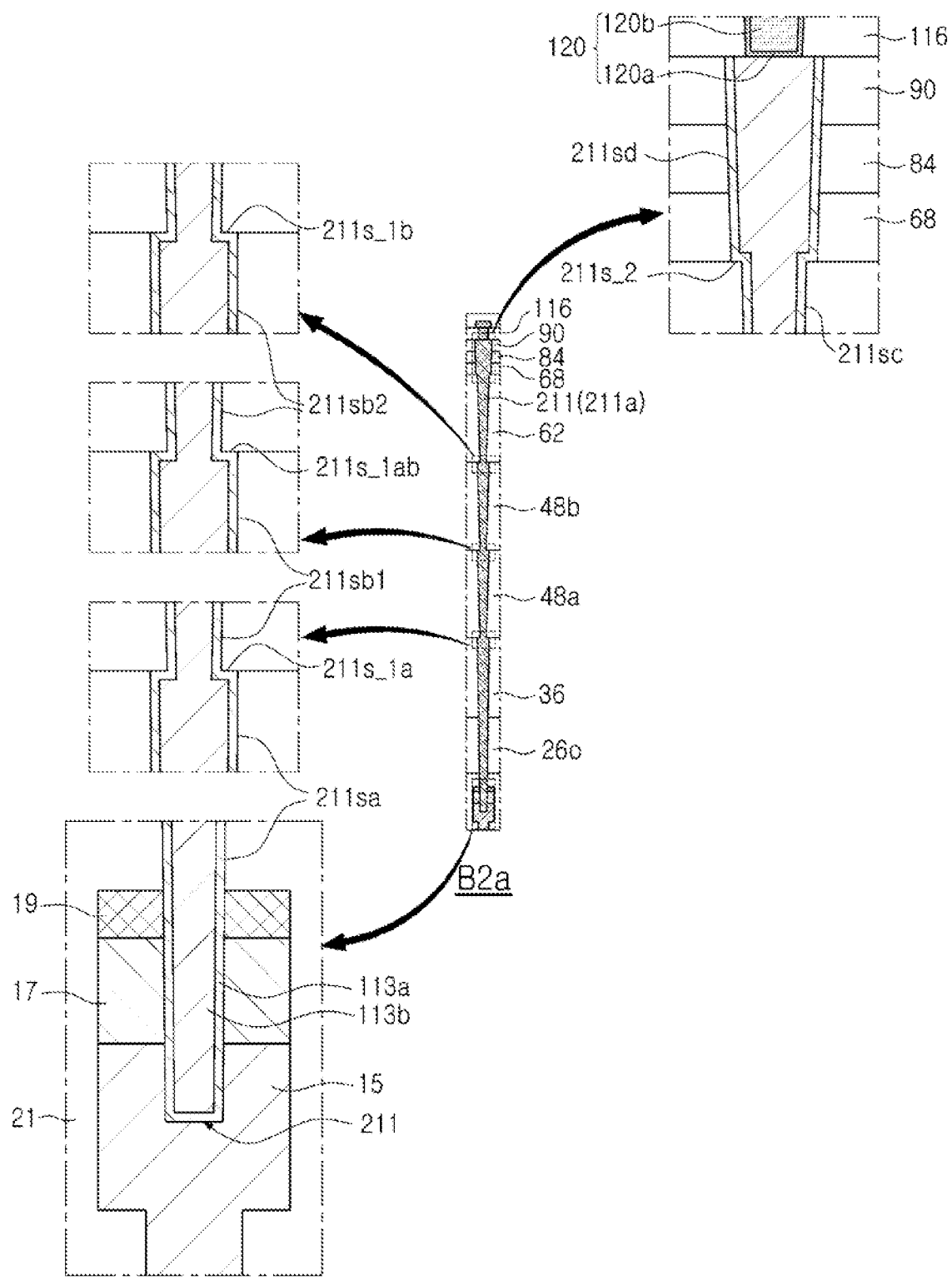

Next, one of the peripheral contact plugs 211 disclosed above will be described with reference to FIG. 5B. FIG. 5B is a partially enlarged view of a region "B2*a*" of FIG. 4A.

Referring to FIG. 5B together with FIGS. 4A, 4B and 5A, in an embodiment, a side surface of the peripheral contact plug 211 include side surface portions 211*sa*, 211*sb*1, 211*sb*2, 211*sc*, and 211*sd* that each have a steep slope, and side surface slope changing portions disposed between adjacent side surface portions 211*sa*, 211*sb*1, 211*sb*2, 211*sc*, and 211*sd* and that each have a relatively gentle slope. On the side surface of the peripheral contact plug 211, the side surface slope changing portions include a plurality "N" of peripheral contact side surface slope changing portions 211*s*_1*a*, 211*s*_1*ab*, and 211*s*_b located at a height level between the lowermost gate layer 32*g*_L and the uppermost gate layer 58*g*_U, and at least one upper side surface slope changing portion 211*s*_2 located at a higher level than that of the uppermost gate layer 58*g*_U.

In embodiments, the "N" peripheral contact side surface slope changing portions 211*s*_1*a*, 211*s*_1*ab*, and 211*s*_b are located at substantially the same height level as the "N" memory side surface slope changing portions 171*s*_1*a*, 171*s*_1*ab*, and 171*s*_1*b* described above with reference to FIG. 5A.

In embodiments, the upper side surface slope changing portion 211*s*_2 of the side surface of the peripheral contact plug 211 are located at substantially the same height level as the upper side surface slope changing portion 171*s*_2 of the side surface of the vertical memory structure 171.

Figure 6:
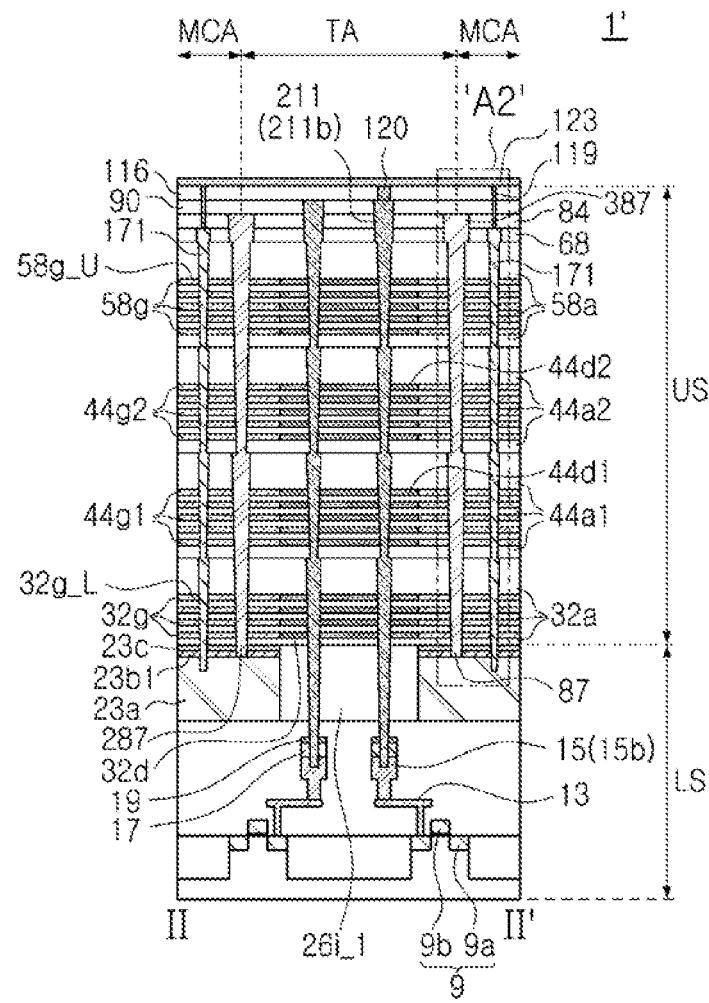
FIGS. 6 and 7 are schematic views of a semiconductor device according to a modified embodiment of the present inventive concept.
Figure 7:
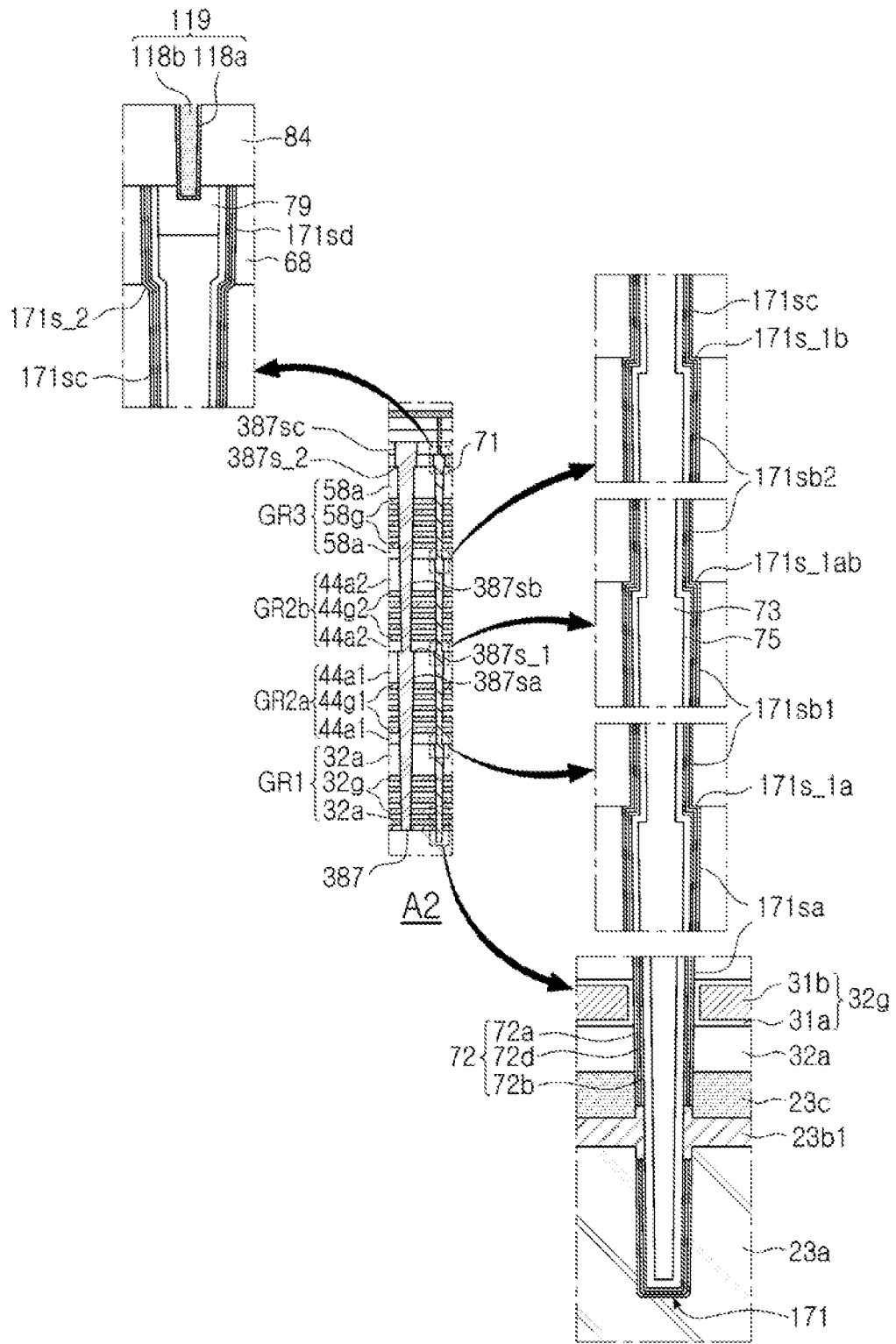

Next, a semiconductor device according to a modified embodiment of the present inventive concept will be described with reference to FIGS. 6 and 7. FIG. 6 is a schematic cross-sectional view taken along line II-IF of FIG. 1, and FIG. 7 is a partially enlarged view of a region "A2" of FIG. 6. In describing a semiconductor device according to a modified embodiment of the present inventive concept with reference to FIGS. 6 and 7, a modified example of the separation structure 287 described above with reference to FIGS. 4B and 5A will be described.

Referring to FIGS. 6 and 7, in an embodiment, the separation structure 287 described above with reference to FIGS. 4B and 5A is replaced with a separation structure 387 of FIGS. 6 and 7. For example, a side surface of the separation structure 387 includes side surface portions 387*sa*, 387*sb*, and 387*sc* that each have a steep slope, and side surface slope changing portions located between adjacent side surface portions 387*sa*, 387*sb*, and 387*sc* and that have a relatively gentle slope. On the side surface of the separation structure 387, the side surface slope changing portions include "N–2" separation side surface slope changing portions 387*s*_1 located at a height level between the lowermost gate layer 32*g*_L and the uppermost gate layer 58*g*_U, and at least one upper side surface slope changing portion 387*s*_2 located at a higher level than the uppermost gate layer 58*g*_U. The upper side surface slope changing portion 171*s*_2 of the side surface of the vertical memory structure 171 and the upper side surface slope changing portion 387*s*_2 of the side surface of the separation structure 387 are located at substantially the same height level.

As described above with reference to FIG. 5A, in an embodiment, when the side surface of the vertical memory structure 171 that is located at the height level between the lowermost gate layer 32*g*_L and the uppermost gate layer 58*g*_U includes "N" memory side surface slope changing portions 171*s*_1*a*, 171*s*_1*ab*, and 171*s*_1*b*, "N–2" is a natural number of 1 or greater and "N" is a natural number of 3 or greater.

In an embodiment, the "N–2" separation side surface slope changing portion 387*s*_1 are located at substantially a sane height level as the intermediate memory side surface slope changing portion 171*s*_*ab* positioned between the lower memory side surface slope changing portion 171*s*_1*a* positioned at a lower portion and the upper memory side surface slope changing portion 171*s*_1*b* positioned at an upper portion, of the "N" memory side surface slope changing portions 171*s*_1*a*, 171*s*_1*ab*, and 171*s*_1*b*.

Figure 8:
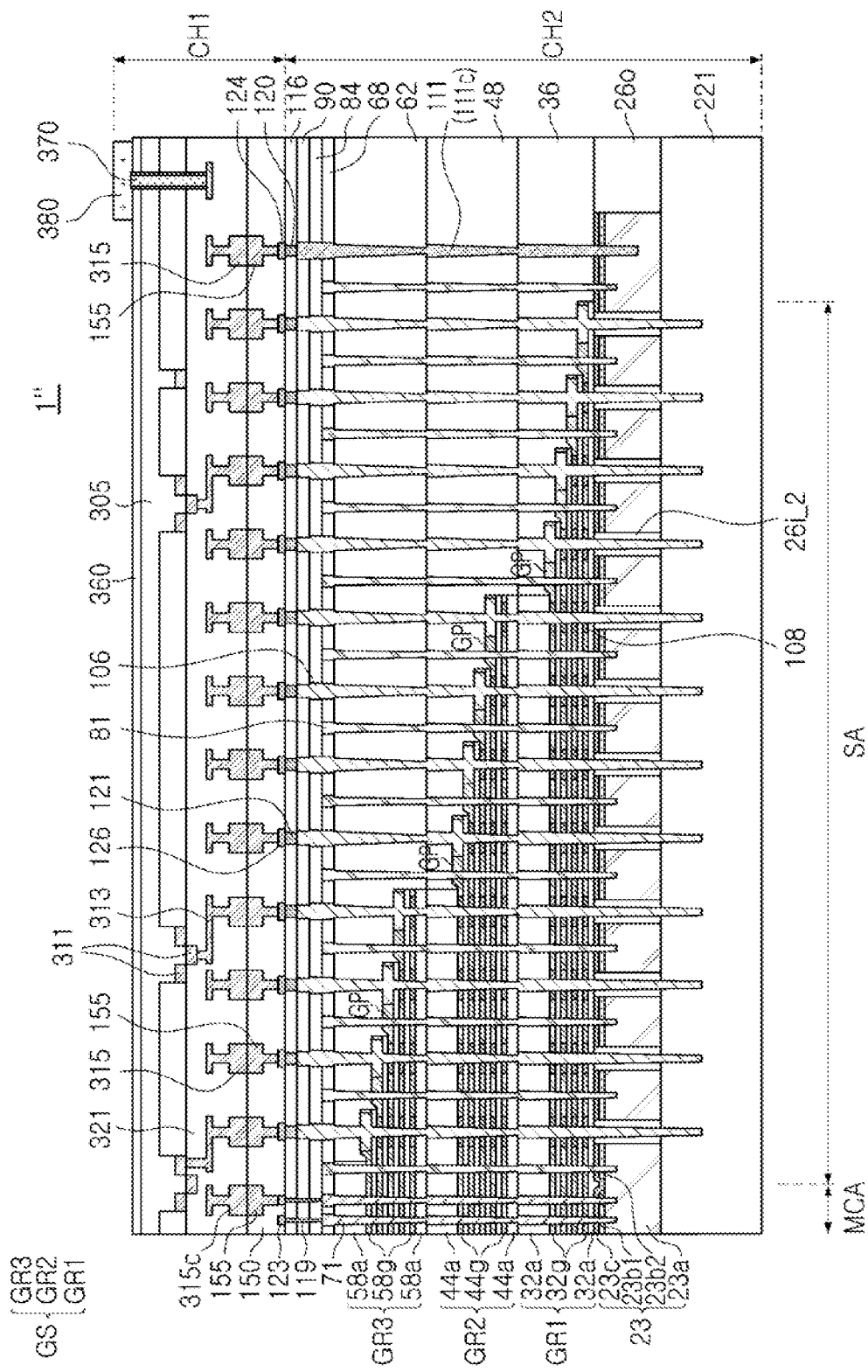
FIG. 8 is a schematic cross-sectional view of a semiconductor device according to a modified embodiment of the present inventive concept.

In the semiconductor device 1 described above with reference to FIGS. 2A and 2B, in an embodiment, the peripheral circuits 9 and 13 are disposed below the stack structure GS. However, embodiments of the present inventive concept are not limited thereto. For example, in other embodiments, the peripheral circuits 9 and 13 is disposed on the stack structure GS. An embodiment in which the peripheral circuits 9 and 13 are disposed on the stack structure GS will be described with reference to FIG. 8. FIG. 8 is a schematic cross-sectional view of a modified example of a semiconductor device according to an embodiment of the present inventive concept.

Referring to FIG. 8, in an embodiment, a semiconductor device 1" includes a first chip structure CH1 and a second chip structure CH2 bonded to the first chip structure CH1. The second chip structure CH2 includes the patterned structure 23, the insulating layers 26*o* and 26*i*_2, the stack structure GS, the intermediate insulation structures 36, 48, and 62, and the upper insulation structures 68, 84, 90, and 116 as described above. The second chip structure CH2 further includes a lower insulation structure 221 that corresponds to the lower insulation structure 21 of FIG. 2A. The second chip structure CH2 further includes gate contact plugs 106 that penetrate through the gate pads GP of the gate layers 32g, 44g, and 58g in the step region SA and are electrically connected to the gate pads GP. The second chip structure CH2 further includes the vertical memory structure 71 of FIG. 2A, the support vertical structure 81 of FIG. 2A, the peripheral contact plugs 111, the separation structures (87 of FIG. 2B), the upper contact plugs 120 of FIG. 2A, the bit line contact plug 119 of FIG. 2A, the bit line 123 of FIG. 2A, and the peripheral interconnection 124 of FIG. 2A as described above.

In an embodiment, the second chip structure CH2 further includes gate connection plugs 121 disposed on the gate contact plugs 106 and gate interconnections 126 disposed on the gate connection plugs 121.

In an embodiment, the second chip structure CH2 further includes first bonding patterns 155 and a first bonding insulating layer 150 that surrounds side surfaces of the first bonding patterns 155. The first bonding patterns 155 are electrically connected to the bit line 123, the gate interconnections 126, and the peripheral interconnection 124. The first bonding patterns 155 include a metal such as copper.

In an embodiment, the first chip structure CH1 includes components similar to those of the lower structure LS as described above. For example, the first chip structure CH1 includes a semiconductor substrate 305, peripheral circuits 311 and 313 below the semiconductor substrate 305, second bonding patterns 315 that are electrically connected to the peripheral circuits 311 and 313 and bonded to the first bonding patterns 155, and a second bonding insulating layer 321 that is bonded to the first bonding insulating layer 150.

In an embodiment, the first chip structure CH1 further includes an insulating layer 360 disposed on the semiconductor substrate 305, an input/output pad 380 disposed on the insulating layer 360, and an input/output connection pattern 370 that penetrates through the semiconductor substrate 305 and the insulating layer 360 and electrically connects the input/output pad 380 to the peripheral circuits 311 and 313.

Figure 9A:
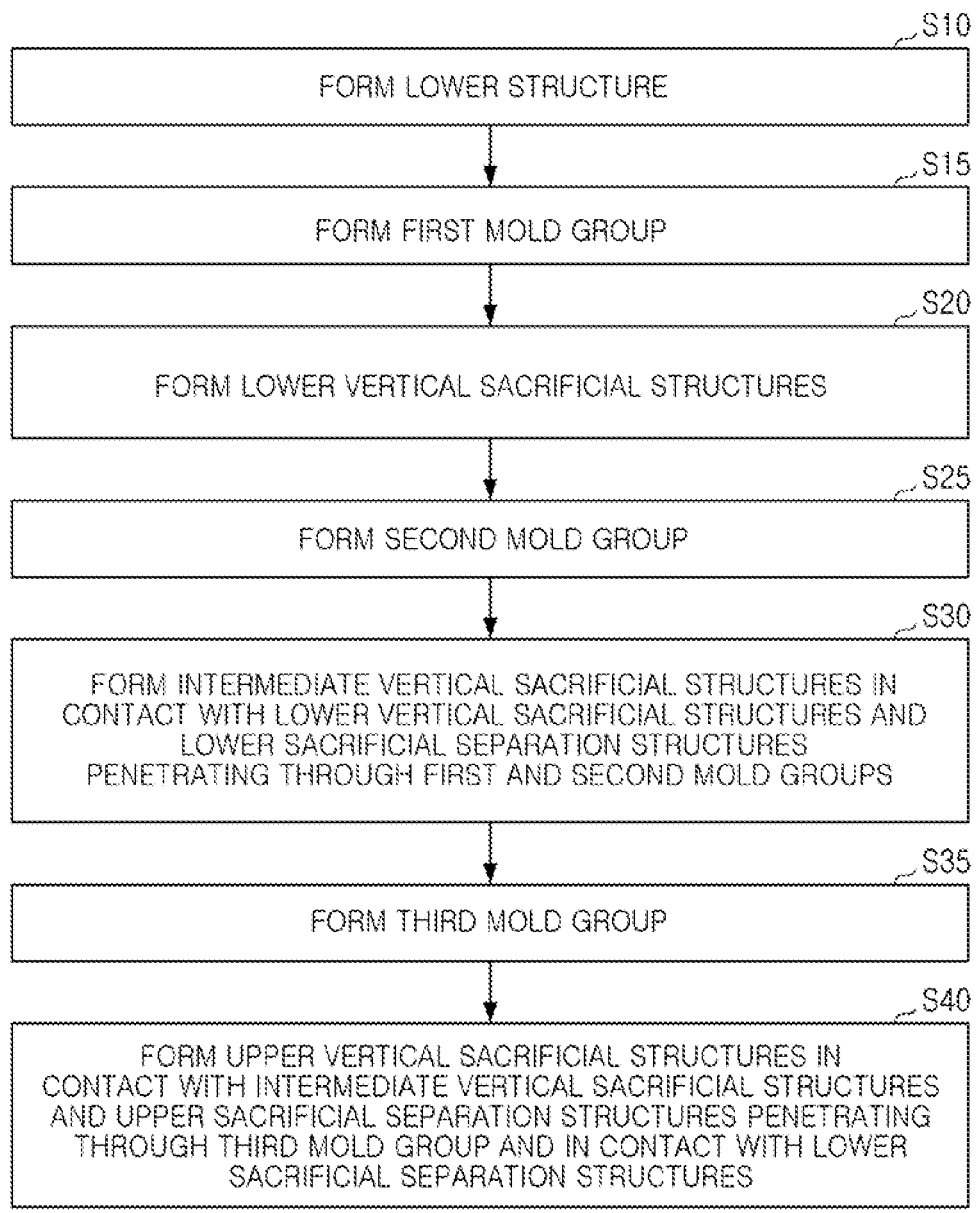
FIGS. 9A and 9B are flowcharts of processes of forming a semiconductor device according to an embodiment of the present inventive concept.
Figure 9B:
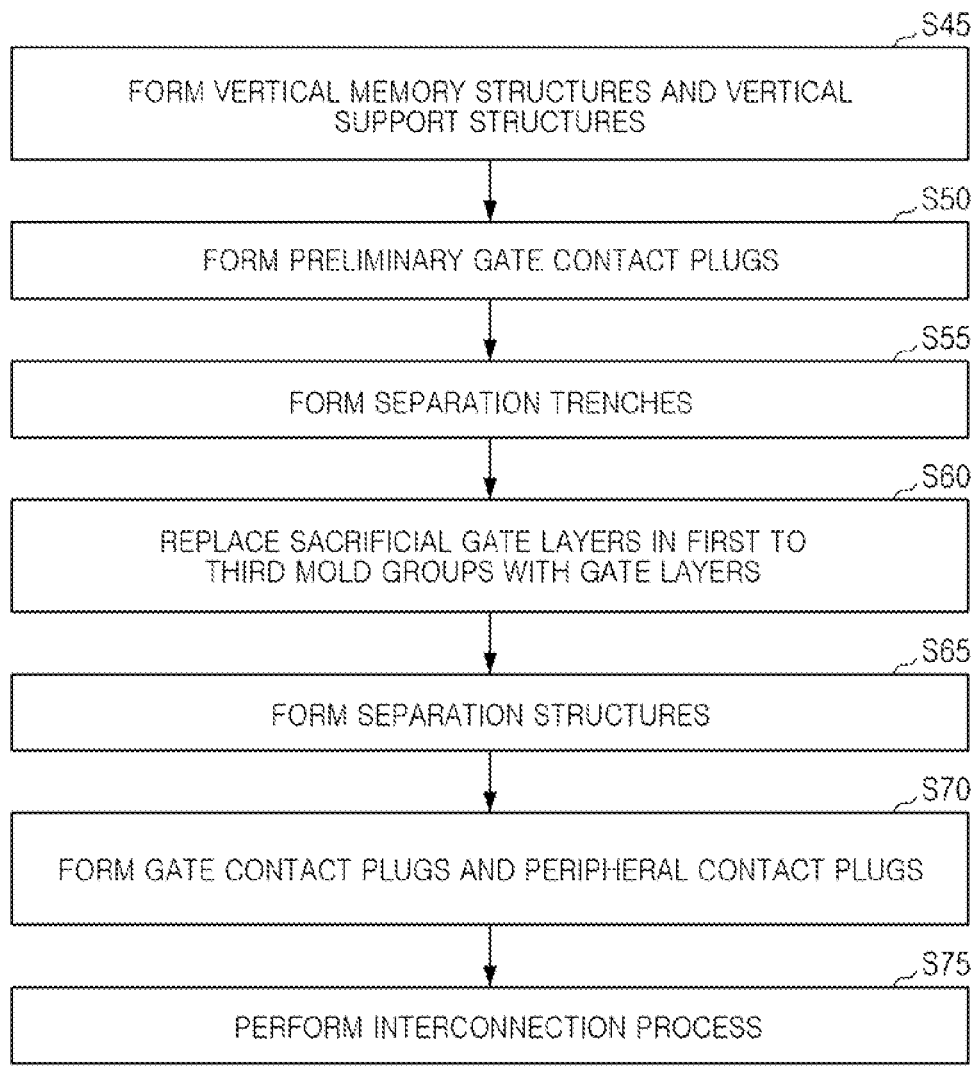
Figure 10A:
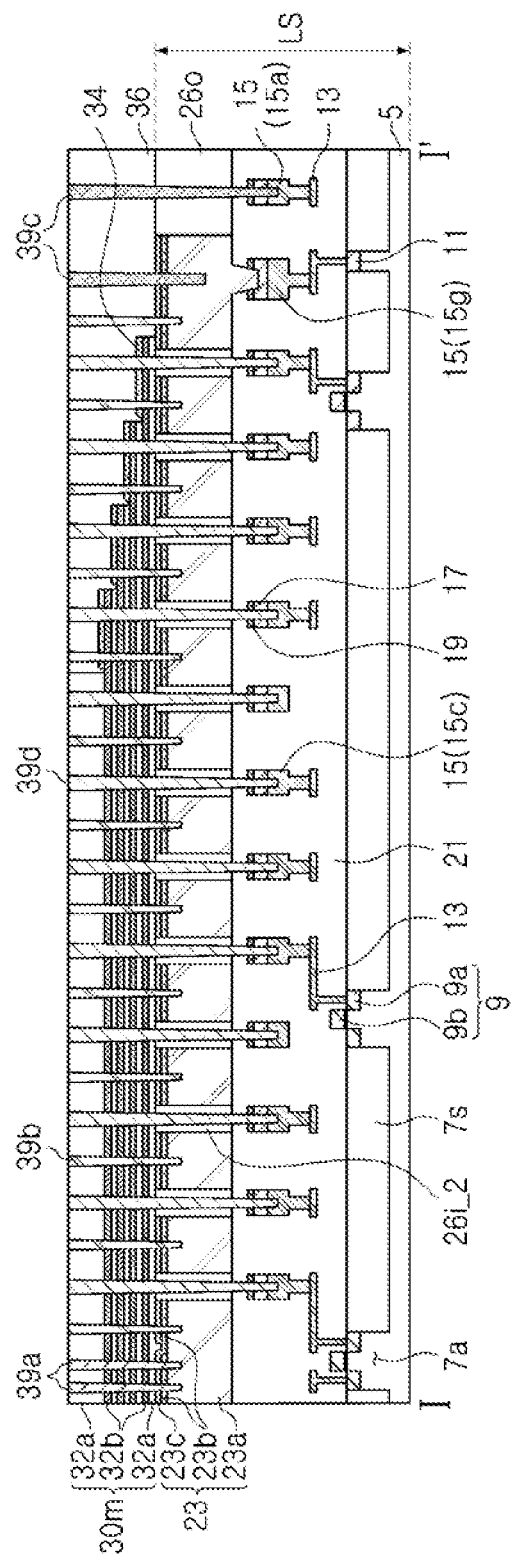
FIGS. 10A, 10B, 11A, and 11B are cross-sectional views that illustrate a method of forming a semiconductor device according to an embodiment of the present inventive concept.
Figure 10B:
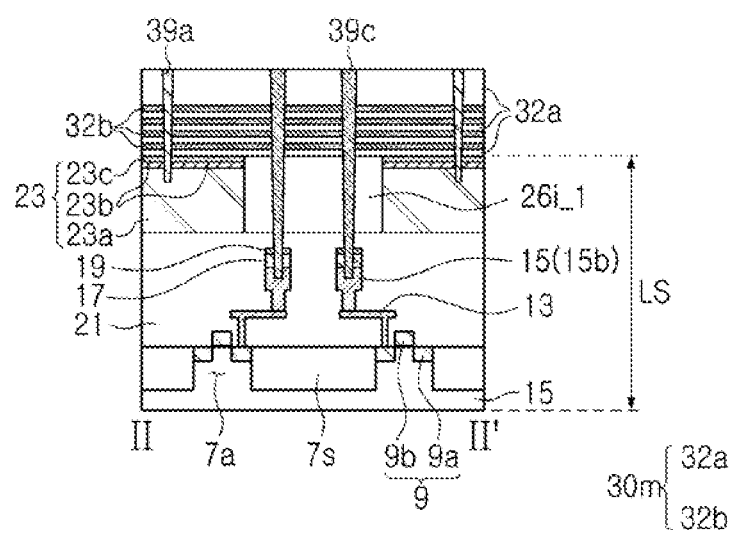
Figure 11A:
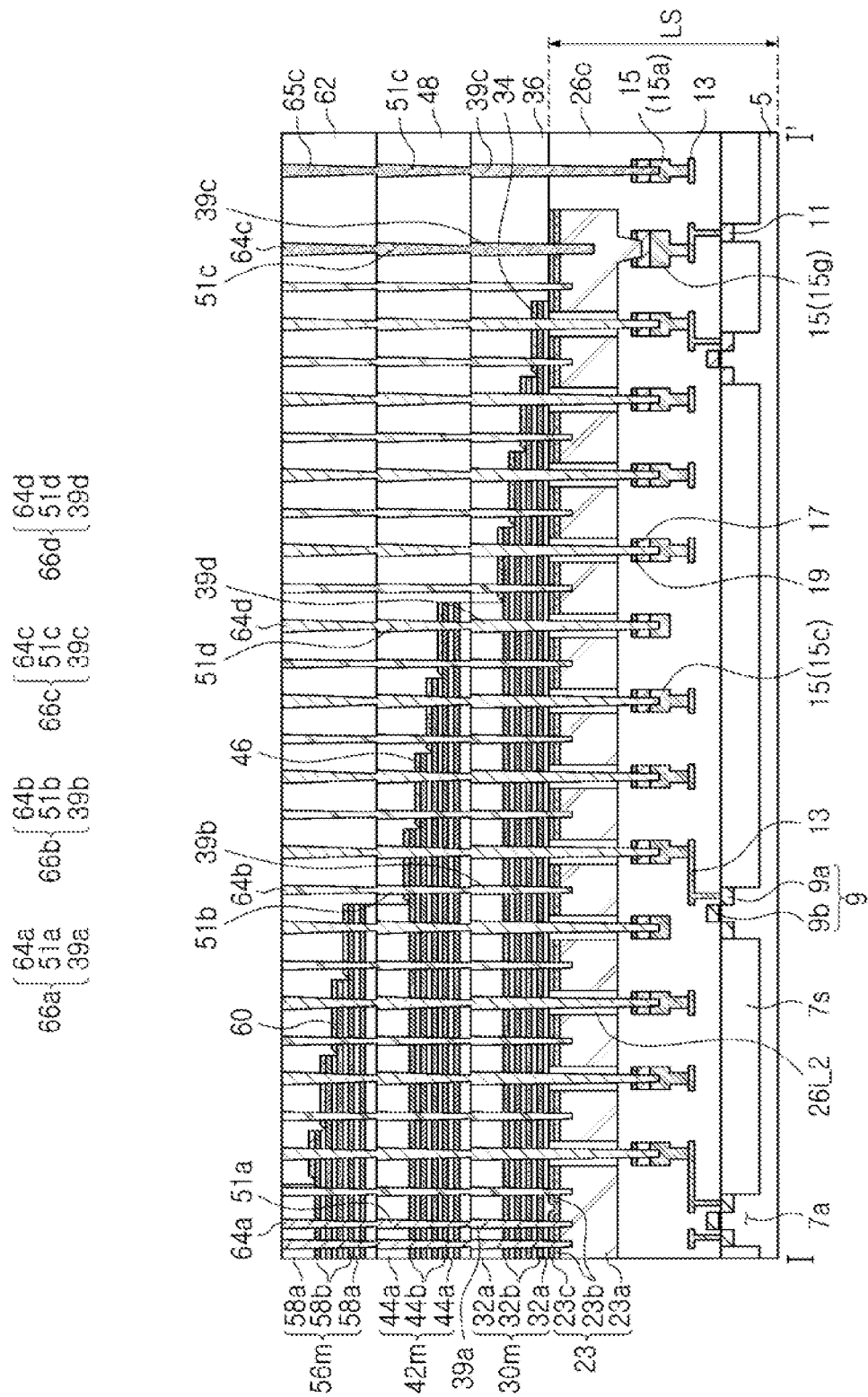
Figure 11B:
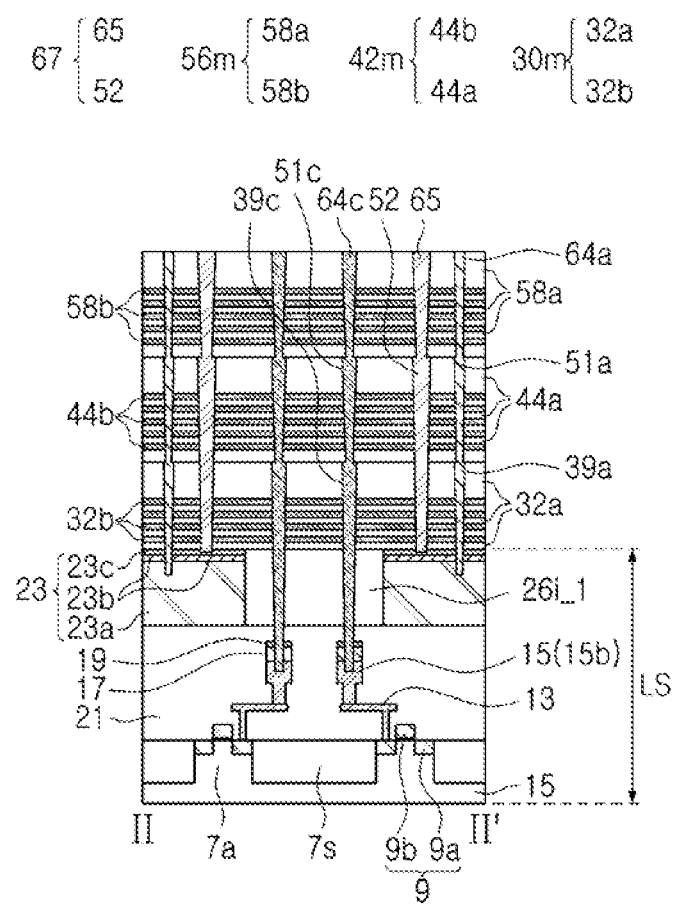

Next, an example of a method of forming a semiconductor device according to an embodiment of the present inventive concept will be described with reference to FIGS. 9A, 9B, 10A, 10B, 11A, and 11B. FIGS. 9A and 9B are flowcharts of a method of forming a semiconductor device according to an embodiment of the present inventive concept, and FIGS. 10A, 10B, 11A and 11B are cross-sectional views that illustrating a method of forming a semiconductor device according to an embodiment of the present inventive concept. FIGS. 10A and 11A are schematic cross-sectional views taken along line I-I' of FIG. 1, and FIGS. 10B and 11B are schematic cross-sectional views taken along line II-IF of FIG. 1.

Referring to FIGS. 1, 9A, 10A, and 10B, in an embodiment, a lower structure LS is formed in operation S10. The lower structure LS may be referred to as a first structure. The formed lower structure LS includes a semiconductor substrate 5, a device isolation layer 7s that defines a peripheral active region 7a on the semiconductor substrate 5, peripheral circuits 9 and 13 formed on the semiconductor substrate 5, peripheral pads 15 that are electrically connected to the peripheral circuits 9 and 13, and a lower insulation structure 21 that covers the peripheral circuits 9 and 13 and the peripheral pads 15 on the semiconductor substrate 5. The peripheral circuits 9 and 13 include a circuit element 9, such as a transistor that includes a peripheral gate 9b and peripheral source/drain 9a and a circuit interconnection 13 that is electrically connected to the circuit element 9. The peripheral pads 15 are electrically connected to the circuit interconnection 13.

In an embodiment, the peripheral pads 15 include first to third peripheral pads 15a, 15b, and 15c. In an embodiment, each of the peripheral pads 15 includes a conductive material, such as a metal such as tungsten.

In an embodiment, the lower structure LS further includes a capping layer 17 formed on each of the peripheral pads 15 and an etch stop layer 19 formed on the capping layer 17. In an embodiment, the capping layer 17 is formed from a silicon layer, and the etch stop layer 19 is formed from an insulating material, such as silicon oxide or silicon nitride.

In an embodiment, forming the lower structure LS further includes forming the patterned structure 23 and the insulating layers 26i_1, 26i_2, and 26o on the lower insulation structure 21. The insulating layers 26i_1, 26i_2, and 26o include an outer insulating layer 26o disposed outside the patterned structure 23, a first inner insulating layer 26i_1 that penetrates through the patterned structure 23, and a second inner insulating layers 26i_2 that penetrates through the patterned structure 23.

In an embodiment, the patterned structure 23 includes a plurality of patterned layers that are sequentially stacked. For example, the patterned structure 23 includes a lower patterned layer 23a, intermediate patterned layers 23b spaced apart from each other and disposed on the lower patterned layer 23a, and an upper patterned layer 23c disposed on the intermediate patterned layers 23b. At least one of the lower patterned layer 23a, the intermediate patterned layers 23b, and the upper patterned layer 23c is a silicon layer. For example, the lower patterned layer 23a and the upper patterned layer 23c are each a silicon layer, such as a silicon layer that has an N-type conductivity, and the intermediate patterned layers 23b is a material layer that differs from the silicon layer, such as a silicon oxide layer and/or a silicon nitride layer.

In an embodiment, a first mold group 30m is formed in operation S15. Forming the first mold group 30m includes forming first interlayer insulating layers 32a and first sacrificial gate layers 32b that are alternately and repeatedly stacked, patterning the first interlayer insulating layers 32a and the first sacrificial gate layers 32b to form a step shape, and forming pad layers 34 on portions of the step-shaped first sacrificial gate layers 32b. The pad layers 34 may be formed on end portions of the step-shaped first sacrificial gate layers 32b. The lowermost layer and the uppermost layer of the first interlayer insulating layers 32a and the first sacrificial gate layers 32b are first interlayer insulating layers. The first interlayer insulating layers 32a are formed of silicon oxide. The first sacrificial gate layers 32b and the pad layers 34 are formed of silicon nitride or polysilicon.

In an embodiment, a first intermediate insulating layer 36 is formed on the lower structure LS and that covers the step-shaped portions of the step-shaped first sacrificial gate layers 32b and the pad layers 34.

In an embodiment, lower vertical sacrificial structures 39a, 39b, 39c, and 39d are formed in operation S20. The lower vertical sacrificial structures 39a, 39b, 39c, and 39d are formed in regions in which the vertical memory structure 71, the support vertical structure 81, the gate contact plugs 106, and the peripheral contact plugs 111 described above with reference to FIGS. 2A and 2B will be formed, respectively.

Referring to FIGS. 1, 9A, 9B, 11A, and 11B, in an embodiment, a second mold group 42m is formed in operation S25. Forming the second mold group 42m includes forming second interlayer insulating layers 44a and second sacrificial gate layers 44b that are alternately and repeatedly stacked, patterning the second interlayer insulating layers 44a and the second sacrificial gate layers 44b to form a step shape, and forming pad layers 46 on portions of the step-shaped second sacrificial gate layers 44b. The pad layers 46 may be formed on end portions of the step-shaped second sacrificial gate layers 44b. The lowermost layer and the uppermost layer of the second interlayer insulating layers 44a and the second sacrificial gate layers 44b are second interlayer insulating layers. The second interlayer insulating layers 44a are formed of silicon oxide. The second sacrificial gate layers 44b and the pad layers 46 are formed of silicon nitride or polysilicon.

In an embodiment, a second intermediate insulating layer 48 is formed on the first intermediate insulating layer 36 and that covers the step-shaped portions of the step-shaped second sacrificial gate layers 44b and the pad layers 46.

In an embodiment, in operation S30, intermediate vertical sacrificial structures 51a, 51b, 51c, and 51d are formed that are respectively in contact with the lower vertical sacrificial structures 39a, 39b, 39c, and 39d, and lower sacrificial separation structures 52 are formed that penetrate through the first and second mold groups 30m and 42m. The lower sacrificial separation structures 52 are spaced apart from the lower patterned layer 23a and are in contact with the upper patterned layer 23c. The lower sacrificial separation structures 52 are spaced apart from the intermediate patterned layers 23b.

In an embodiment, a third mold group 56m is formed in operation S35. Forming the third mold group 56m includes forming third interlayer insulating layers 58a and third sacrificial gate layers 58b that are alternately and repeatedly stacked, patterning the third interlayer insulating layers 58a and the third sacrificial gate layers 58b to form a step shape, and forming pad layers 60 on portions of the step-shaped third sacrificial gate layers 58b. The pad layers 60 may be formed on end portions of the step-shaped third sacrificial gate layers 58b. The lowermost layer and the uppermost layer of the third interlayer insulating layers 58a and the third sacrificial gate layers 58b are third interlayer insulating layers. The third interlayer insulating layers 58a is formed of silicon oxide. The third sacrificial gate layers 58b and the pad layers 60 are formed of silicon nitride or polysilicon.

In an embodiment, a third intermediate insulating layer 62 is formed on the second intermediate insulating layer 48 and that covers the step-shaped portions of the step-shaped third sacrificial gate layers 58b and the pad layers 60.

In an embodiment, in operation S40, upper vertical sacrificial structures 64a, 64b, 64c, and 64d are formed that are respectively in contact with the intermediate vertical sacrificial structures 51a, 51b, 51c, and 51d, and upper sacrificial separation structures 65 are formed that penetrate through the third mold group 56m to be in contact with the lower sacrificial separation structures 52.

In an embodiment, the lower vertical sacrificial structures 39a, 39b, 39c, and 39d, the intermediate vertical sacrificial structures 51a, 51b, 51c, and 51d, and the upper vertical sacrificial structures 64a, 64b, 64c, and 64d constitute the vertical sacrificial structures 66a, 66b, 66c, and 66d, and the lower sacrificial separation structures 52 and the upper sacrificial separation structures 65 constitute the sacrificial separation structures 67.

In an embodiment, referring now to FIG. 9B, in operation S45, vertical sacrificial structures 66a, 66b, 66c, and 66d are formed in regions in which the vertical memory structure 71, the support vertical structure 81, the gate contact plugs 106, and the peripheral contact plugs 111 are to be formed, respectively. For example, the vertical sacrificial structures 66a, 66b, 66c, and 66d include a memory sacrificial vertical structure 66a for forming the vertical memory structure 71, a support sacrificial vertical structure 66b for forming the support vertical structure 81, peripheral contact vertical sacrificial structures 66c for forming the peripheral contact plugs 111, and a gate contact sacrificial vertical structure 66d for forming the gate contact plug 106.

Referring to FIGS. 1, 9B, 11A, 11B, 2A and 2B, in an embodiment, a first upper insulating layer 68 is formed on the vertical sacrificial structures 66a, 66b, 66c, and 66d, the third mold group 56m, and the third intermediate insulating layer 62.

In an embodiment, holes that penetrate through the first upper insulating layer 68 are formed that expose the memory sacrificial vertical structure 66a and the support sacrificial vertical structure 66b, respectively, and the exposed memory sacrificial vertical structure 66a and the exposed support sacrificial vertical structure 66b are removed to form a memory vertical hole and a support vertical hole, and a vertical memory structure 71 and a support vertical structure 81 are formed in the memory vertical hole and the support vertical hole, respectively.

In an embodiment, a second upper insulating layer 84 is formed on the first upper insulating layer 68. Preliminary gate contact plugs are formed in operation S50. Forming the preliminary gate contact plugs includes forming holes that expose the gate contact sacrificial vertical structure 66d sequentially through the second upper insulating layer 84 and the first upper insulating layer 68, removing the gate contact sacrificial vertical structure 66d exposed by the holes to form preliminary gate contact holes, partially etching the sacrificial gate layers 32b, 44b, and 58b and the pad layers 34, 56, and 60 exposed by the preliminary gate contact holes to form spaces, forming buffer insulating layers 103 that fill the spaces formed by partially etching those sacrificial gate layers 32b, 44b, and 58b not in contact with the pad layers 34, 56, and 60, and forming a material layer that partially fills the spaces formed by partially etching the pad layers 34, 56, and 60 and those sacrificial gate layers 32b, 44b, and 58b in contact with the pad layers 34, 56, and 60.

In an embodiment, separation trenches are formed in operation S55. Forming the separation trenches includes forming openings that sequentially penetrate through the first and second upper insulating layers 68 and 84 that expose the sacrificial separation structures 67 and removing the exposed sacrificial separation structures 67.

In an embodiment, a sacrificial spacer is formed on side walls of the separation trenches to expose the intermediate patterned layer at a lower portion of the intermediate patterned layers 23b in the first region M, the exposed intermediate pattered layer at a lower portion of the first region MCA is removed, the first intermediate patterned layer 23b1 is formed in a space formed by removing the exposed intermediate patterned layer, and the sacrificial spacer is removed. An intermediate patterned layer of the intermediate patterned layers 23b at a lower portion of the second region SA remains and forms a second intermediate patterned layer 23b2.

In an embodiment, the sacrificial gate layers 32b, 44b, and 58b in the first to third mold groups 30m, 42m, and 56m are replaced with the gate layers 32g, 44g, and 58g in operation S60. For example, the sacrificial gate layers 32*b*, 44*b*, and 58*b* exposed by the separation trenches are etched to form voids, and the gate layers 32*g*, 44*g*, and 58*g* are formed in the voids.

In an embodiment, during the process of etching the sacrificial gate layers 32*b*, 44*b*, and 58*b* to form voids, the vertical memory structure 71 and the support vertical structure 81 serve as a support to prevent bending or deformation of the interlayer insulating layers 32*a*, 44*a*, and 58*a*.

In an embodiment, in the through region TA, a portion of the sacrificial gate layers 32*b*, 44*b*, and 58*b* remain to form horizontal insulating layers 32*d*, 44*d*, and 58*d*.

In an embodiment, separation structures 87 are formed in operation S65. The separation structures 87 may be formed in the separation trenches.

In an embodiment, a third upper insulating layer 90 is formed on the second upper insulating layer 84. Gate contact plugs 106 and peripheral contact plugs 111 are formed in operation S70. Forming the gate contact plugs 106 and the peripheral contact plugs 111 include forming holes that penetrate through the third upper insulating layer 90 and expose the preliminary gate contact plugs, forming holes that penetrate through the first to third upper insulating layers 68, 84, and 90 and expose the peripheral contact vertical sacrificial structures 66*c*, removing the exposed preliminary gate contact plugs and the exposed peripheral contact vertical sacrificial structures 66*c* to form gate contact holes and peripheral contact holes, respectively, and filling the gate contact holes and the peripheral contact holes with conductive materials, respectively. The buffer insulating layers 103 remains while the exposed preliminary gate contact plugs are removed.

In an embodiment, a fourth upper insulating layer 116 is formed on the third upper insulating layer 90. An interconnection process is performed in operation S75. Performing the interconnection process includes forming a bit line contact plug 119 that penetrates through the first to fourth upper insulating layers 68, 84, 90, and 116 and that electrically connects to the vertical memory structure 71, forming upper contact plugs 120 that penetrate through the fourth upper insulating layer 116 and that electrically connects to the peripheral contact plugs 111, and forming a bit line 123 and a peripheral interconnection 124.

Figure 12:
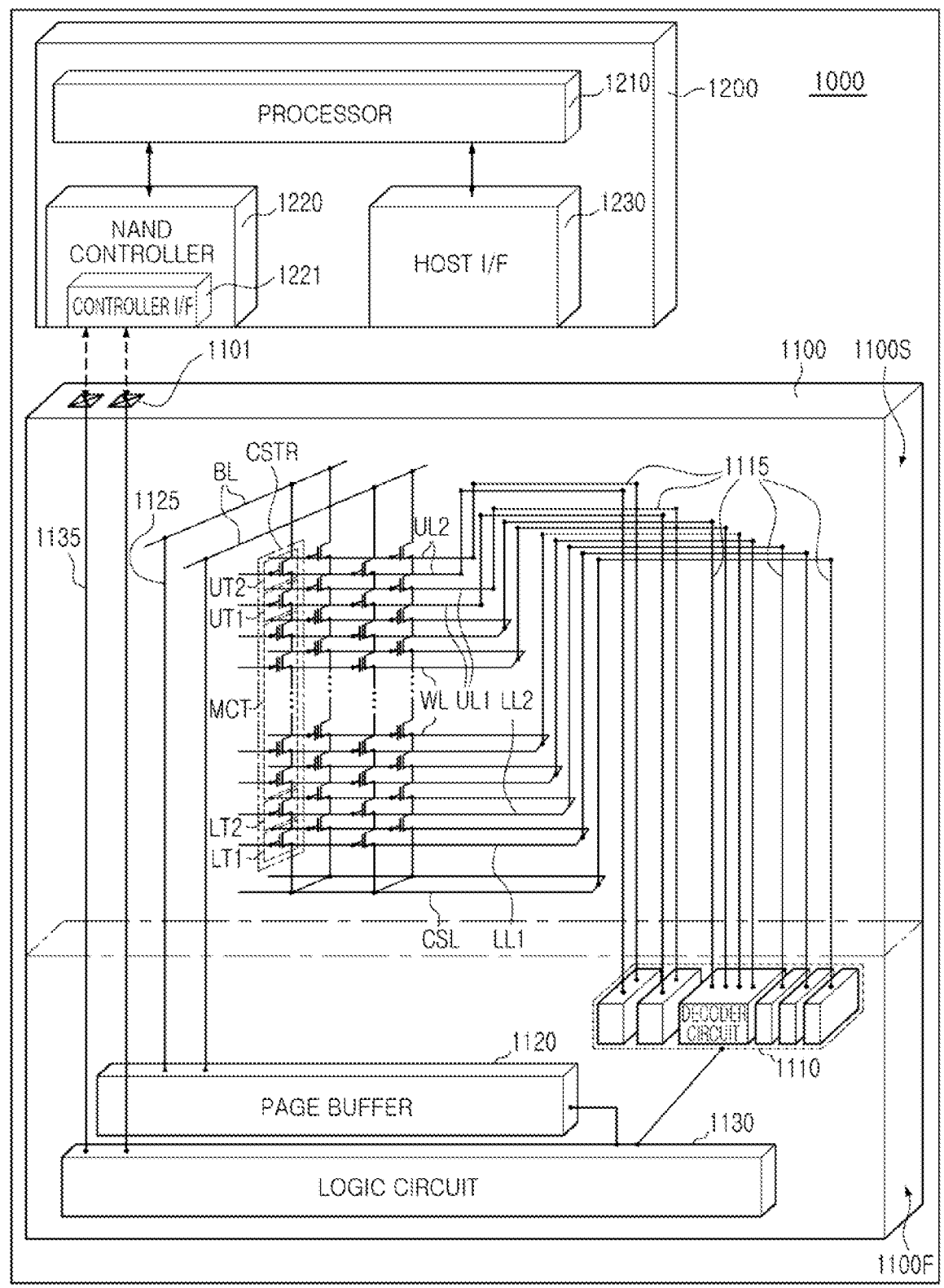
FIG. 12 schematically illustrates a data storage system that includes a semiconductor device according to an embodiment of the present inventive concept.

FIG. 12 schematically illustrates a data storage system that includes a semiconductor device according to an embodiment of the present inventive concept.

Referring to FIG. 12, a data storage system 1000 according to an embodiment of the present inventive concept includes a semiconductor device 1100 and a controller 1200 that is electrically connected to the semiconductor device 1100. The data storage system 1000 may be a storage device that includes the semiconductor device 1100 or an electronic device that includes the storage device. For example, the data storage system 1000 may be a solid state drive (SSD) device, a universal serial bus (USB), a computing system, a medical device, or a communication device that includes the semiconductor device 1100.

In an embodiment, the data storage system 1000 is an electronic system that stores data.

In an embodiment, the semiconductor device 1100 may be one according to any of embodiments described above with reference to FIGS. 1 to 8 or may be manufactured by a method for forming a semiconductor device described above with reference to FIGS. 9A to 11B. The semiconductor device 1100 includes a first structure 1100F and a second structure 1100S on the first structure 1100F.

In an embodiment, the first structure 1100F is a peripheral circuit structure that includes a decoder circuit 1110, a page buffer 1120, and a logic circuit 1130. For example, the first structure 1100F includes the peripheral circuit 9 of FIG. 2A, described above.

In an embodiment, the second structure 1100S is a memory cell structure that includes a bit line BL, a common source line CSL, word lines WL, first and second gate upper lines UL1 and UL2, first and second gate lower lines LL1 and LL2, and memory cell strings CSTR between the bit line BL and the common source line CSL.

In an embodiment, the patterned structure 23 described above includes a silicon layer having an N-type conductivity, and the N-type conductivity silicon layer is the common source line CSL.

In an embodiment, in the second structure 1100S, each of the memory cell strings CSTR includes lower transistors LT1 and LT2 adjacent to the common source line CSL, upper transistors UT1 and UT2 adjacent to the bit line BL, and a plurality of memory cell transistors MCT disposed between the lower transistors LT1 and LT2 and the upper transistors UT1 and UT2. The number of the lower transistors LT1 and LT2 and the number of the upper transistors UT1 and UT2 may be variously modified according to embodiments.

In embodiments, the upper transistors UT1 and UT2 each include a string select transistor, and the lower transistors LT1 and LT2 each include a ground select transistor. The gate lower lines LL1 and LL2 are gate electrodes of the lower transistors LT1 and LT2, respectively. The word lines WL are gate electrodes of the memory cell transistors MCT, and the gate upper lines UL1 and UL2 are gate electrodes of the upper transistors UT1 and UT2, respectively.

In an embodiment, the gate layers 32*g*, 44*g*, and 58*g* described above constitute the gate lower lines LL1 and LL2, the word lines WL, and the gate upper lines UL1 and UL2.

In embodiments, the lower transistors LT1 and LT2 each include a lower erase control transistor LT1 and a ground select transistor LT2 connected in series. The upper transistors UT1 and UT2 each include a string select transistor UT1 and an upper erase control transistor UT2 connected in series. At least one of the lower erase control transistor LT1 and the upper erase control transistor UT1 is used for an erase operation to delete data stored in the memory cell transistors MCT using a gate induced drain leakage (GIDL) phenomenon.

In an embodiment, the common source line CSL, the first and second gate lower lines LL1 and LL2, the word lines WL, and the first and second gate upper lines UL1 and UL2 are electrically connected to the decoder circuit 1110 through first connection interconnections 1115 that extend from the first structure 1100F to the second structure 1100S.

In an embodiment, the bit lines BL are electrically connected to the page buffer 1120 through second connection interconnections 1125 that extend from the first structure 1100F to the second structure 1100S. The bit lines BL are the bit lines 123 described above.

In an embodiment, in the first structure 1100F, the decoder circuit 1110 and the page buffer 1120 execute a control operation on at least one selected memory cell transistor of the plurality of memory cell transistors MCT. The decoder circuit 1110 and the page buffer 1120 are controlled by the logic circuit 1130. The semiconductor device 1000 communicates with the controller 1200 through an input/output pad 1101 that is electrically connected to the logic circuit 1130. The input/output pad 1101 is electrically connected to the logic circuit 1130 through an input/output connection interconnection 1135 that extends from the first structure 1100F to the second structure 1100S.

In an embodiment, the controller 1200 includes a processor 1210, a NAND controller 1220, and a host interface 1230. In some embodiments, the data storage system 1000 includes a plurality of semiconductor devices 1100. In this case, the controller 1200 controls the plurality of semiconductor devices 1000.

In an embodiment, the processor 1210 controls an overall operation of the data storage system 1000 and the controller 1200. The processor 1210 operates according to pre-loaded firmware and accesses the semiconductor device 1100 by controlling the NAND controller 1220. The NAND controller 1220 includes a NAND interface 1221 that processes communication with the semiconductor device 1100. Through the NAND interface 1221, a control command for controlling the semiconductor device 1100, data to be written to the memory cell transistors MCT of the semiconductor device 1100, and data to be read from the memory cell transistors MCT, can be transmitted. The host interface 1230 provides a communication function between the data storage system 1000 and an external host. When a control command is received from an external host through the host interface 1230, the processor 1210 controls the semiconductor device 1100 in response to the control command.

Figure 13:
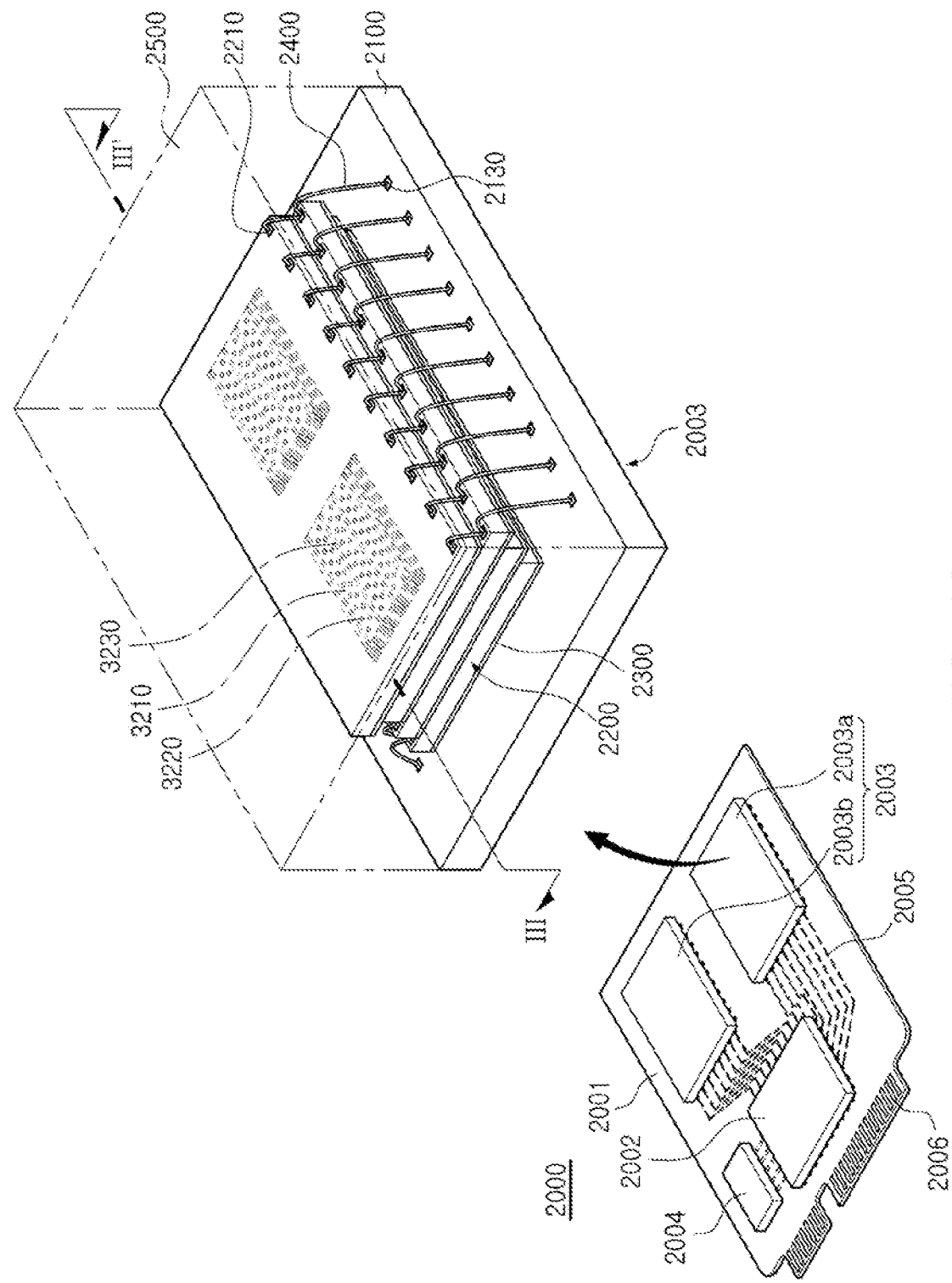
FIG. 13 is a perspective view schematically of a data storage system that includes a semiconductor device according to an embodiment of the present inventive concept.

FIG. 13 is a perspective view of a data storage system that includes a semiconductor device according to an embodiment of the present inventive concept.

Referring to FIG. 13, a data storage system 2000 according to an embodiment of the present inventive concept includes a main substrate 2001, a controller 2002 mounted on the main substrate 2001, one or more semiconductor packages 2003, and a DRAM 2004. The semiconductor package 2003 and the DRAM 2004 are connected to the controller 2002 by interconnection patterns 2005 formed on the main substrate 2001.

In an embodiment, the main substrate 2001 includes a connector 2006 that includes a plurality of pins coupled to an external host. The number and arrangement of the plurality of pins in the connector 2006 may vary depending on a communication interface between the data storage system 2000 and the external host. In embodiments, the data storage system 2000 can communicate with the external host according to any of a variety of interfaces such as a universal serial bus (USB), a peripheral component interconnect express (PCI-Express), a serial advanced technology attachment (SATA), and an M-Phy for universal flash storage (UFS). In embodiments, the data storage system 2000 operates by power supplied by the external host through the connector 2006. The data storage system 2000 further includes a power management integrated circuit (PMIC) that distributes power received from the external host to the controller 2002 and the semiconductor package 2003.

In an embodiment, the controller 2002 can write data into or read data from the semiconductor package 2003, and can increase an operating speed of the data storage system 2000.

In an embodiment, the DRAM 2004 is a buffer memory that mitigates a speed difference between the semiconductor package 2003 functioning as a data storage space and an external host. The DRAM 2004 in the data storage system 2000 also operates as a cache memory and provides a space for temporarily storing data in a control operation for the semiconductor package 2003. When the DRAM 2004 is included in the data storage system 2000, the controller 2002 further includes a DRAM controller that controls the DRAM 2004 in addition to the NAND controller that controls the semiconductor package 2003.

In an embodiment, the semiconductor package 2003 includes first and second semiconductor packages 2003a and 2003b that are spaced apart from each other. Each of the first and second semiconductor packages 2003a and 2003b is a semiconductor package that includes a plurality of semiconductor chips 2200. Each of the semiconductor chips 2200 includes a semiconductor device according to any of embodiments described above with reference to FIGS. 1 to 3 or a semiconductor device manufactured by a method of forming a semiconductor device described above with reference to FIGS. 9A to 11B.

In an embodiment, each of the first and second semiconductor packages 2003a and 2003b includes a package substrate 2100, semiconductor chips 2200 on the package substrate 2100, adhesive layers 2300 disposed on a lower surface of each of the semiconductor chips 2200, a connection structure 2400 that electrically connects the semiconductor chips 2200 to the package substrate 2100, and a molding layer 2500 that covers the semiconductor chips 2200 and the connection structure 2400 on the package substrate 2100.

In an embodiment, the package substrate 2100 is a printed circuit board that includes package upper pads 2130. Each of the semiconductor chips 2200 includes an input/output pad 2210.

In embodiments, the connection structure 2400 is a bonding wire that electrically connects the input/output pad 2210 and the upper package pads 2130 to each other. Accordingly, in each of the first and second semiconductor packages 2003a and 2003b, the semiconductor chips 2200 are electrically connected to each other by a bonding wire and are electrically connected to the package upper pads 2130 of the package substrate 2100. Alternatively, according to embodiments, in each of the first and second semiconductor packages 2003a and 2003b, the semiconductor chips 2200 are electrically connected to each other by a connection structure that including a through-silicon via (TSV), instead of the bonding-wire-type connection structure 2400.

In embodiments, the controller 2002 and the semiconductor chips 2200 are included in one package. For example, the controller 2002 and the semiconductor chips 2200 are mounted on a separate interposer substrate that differs from the main substrate 2001, and the controller 2002 and the semiconductor chips 2200 are connected to each other by a wiring formed on the interposer substrate.

Figure 14:
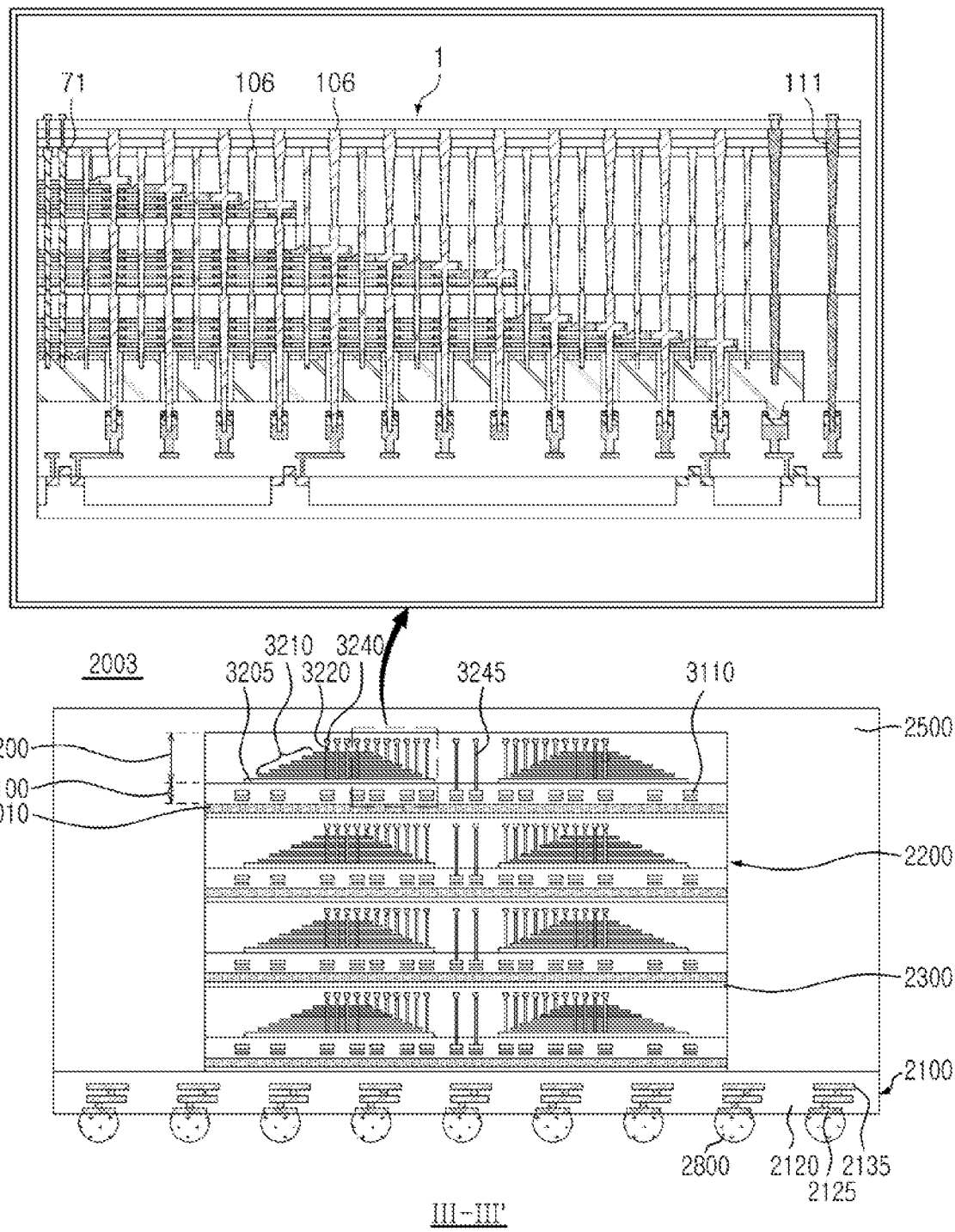
FIG. 14 is a cross-sectional view of a data storage system that includes a semiconductor device according to an embodiment of the present inventive concept.

FIG. 14 is cross-sectional views of a semiconductor package according to an example embodiment of the present inventive concept. FIG. 14 illustrates a semiconductor package 2003 of FIG. 13 and conceptually illustrates a region of the semiconductor package 2003 of FIG. 13, taken along line III-III'.

Referring to FIGS. 13 AND 14, in an embodiment, the package substrate 2100 of the semiconductor package 2003 is a printed circuit board. The package substrate 2100 includes a package substrate body portion 2120, package upper pads 2130 of FIG. 13 disposed on an upper surface of the package substrate body portion 2120, lower pads 2125 disposed on a lower surface of the package substrate body portion 2120 or exposed through the lower surface, and internal interconnections 2135 that electrically connect the upper pads 2130 and the lower pads 2125 to each other in the package substrate body portion 2120. The upper pads 2130 of FIG. 13 are electrically connected to the connection structures 2400 of FIG. 13. The lower pads 2125 are connected to the interconnection patterns 2005 of the main substrate 2010 of the data storage system 2000 through conductive connection portions 2800.

In an embodiment, each of the semiconductor chips 2200 includes a semiconductor substrate 3010 and a first structure 3100 and a second structure 3200 that are sequentially stacked on the semiconductor substrate 3010. The first structure 3100 includes a peripheral circuit region that includes peripheral interconnections 3110. The second structure 3200 includes a common source line 3205, a gate stack structure 3210 disposed on the common source line 3205, memory channel structures 3220 and separation structures 3230 of FIG. 13 that penetrate through the gate stack structure 3210, bit lines 3240 that electrically connect to the memory channel structures 3220, and gate contact plugs 106 in FIG. 2A that electrically connect to the word lines WL of the gate stack structure 3210. The first structure 3100 includes the first structure 1100F of FIG. 12, and the second structure 3200 includes the second structure 1100S of FIG. 12.

In an embodiment, each of the semiconductor chips 2200 includes a through interconnection 3245 that electrically connects to the peripheral interconnections 3110 of the first structure 3100 and extends into the second structure 3200. The through interconnection 3245 penetrates the gate stack structure 3210 and is further disposed outside the gate stack structure 3210.

In an embodiment, each of the semiconductor chips 2200 further includes an input/output connection interconnection 1135 of FIG. 12 that electrically connects to the peripheral interconnections 3110 of the first structure 3100 and extends into the second structure, and an input/output pad 2210 of FIG. 13 that electrically connects to the input/output connection interconnection 1135 of FIG. 12.

In FIG. 14, in an embodiment, an enlarged portion of the semiconductor device 1 indicated by reference numeral 1 illustrates that the semiconductor chips 2200 of FIG. 14 can be modified to include the cross-sectional structure shown in FIG. 2A. Accordingly, each of the semiconductor chips 2200 includes the semiconductor device 1 according to any of embodiments described above with reference to FIGS. 1 to 8 or the semiconductor device 1 manufactured by a method of forming a semiconductor device described above with reference to FIGS. 9A to 16B.

As set forth above, according to embodiments of the inventive concept, since gate layers can be stacked in a vertical direction, the degree of integration of the semiconductor device can be increased. Thus, a semiconductor device with ion increased degree of integration and a data storage system that includes the same can be provided.

According to embodiments of the inventive concept, a method of simultaneously performing some of semiconductor processes that form a vertical memory structure, a support vertical structure, gate contact plugs, peripheral contact plugs, and a separation structure, while increasing the number of gate layers stacked in a vertical direction, is provided. Thus, productivity can be increased and the degree of integration of a semiconductor device is increased.

While embodiments have been shown and described above, it will be apparent to those skilled in the art that modifications and variations could be made without departing from the scope of the present inventive concept as defined by the appended claims.

What is claimed is:

1. A semiconductor device, comprising:
a first structure;
a second structure that includes a stack structure and an insulation structure that covers at least a portion of the stack structure;
a vertical memory structure that penetrates through at least the stack structure; and
a separation structure that penetrates through at least the stack structure and that has an upper surface located at a higher level than an upper surface of the vertical memory structure,
wherein
the stack structure includes at least three gate stack groups that are stacked on the first structure in a vertical direction,
each of the at least three gate stack groups includes a plurality of gate layers that are stacked and spaced apart from each other in the vertical direction,
at a height level between a lowermost gate layer and an uppermost gate layer of the plurality of gate layers of the stack structure, a side surface of the vertical memory structure includes a plurality of "N" memory side surface slope changing portions,
a side surface of the separation structure includes "M" of separation side surface slope changing portion that is positioned at substantially a same height level as "M" of memory side surface slope changing portion of the plurality of "N" memory side surface slope changing portions, wherein "M"< "N",
"N" is a natural number of 2 or greater,
"M" is a natural number of 1 or greater, and
at a higher level than the uppermost gate layer, the side surface of the vertical memory structure includes a first upper slope changing portion.

2. The semiconductor device of claim 1, wherein
each of the plurality of "N" memory side surface slope changing portions and the "M" of separation side surface slope changing portion has a first slope between an upper side surface portion and a lower side surface portion, and
the first slope is less steep than a slope of each of the upper side surface portion and the lower side surface portion.

3. The semiconductor device of claim 1, wherein
the at least three gate stack groups include a first gate stack group, a second gate stack group, and a third gate stack group that are sequentially stacked in the vertical direction,
"N" is 2, and "M" is 1, and
the separation side surface slope changing portion is located at a same height level as that of a higher memory side surface slope changing portion of two of the plurality of memory side surface slope changing portions.

4. The semiconductor device of claim 1, wherein
the at least three gate stack groups include a first gate stack group, a second gate stack group, a third gate stack group, and a fourth gate stack group that are sequentially stacked in the vertical direction,
"N" is 3, and "M" is 2, and
two of the separation side surface slope changing portions are located at substantially a same height level as two of the memory side surface slope changing portions that are positioned at a higher level than a lowermost memory side surface slope changing portion of three of the memory side surface slope changing portions.

5. The semiconductor device of claim 1, wherein
the at least three gate stack groups include a first gate stack group, a second gate stack group, a third gate stack group, and a fourth gate stack group that are sequentially stacked in the vertical direction, "N" is 3, and "M" is 1, and
the separation side surface slope changing portion is located at substantially a same height level as an intermediate memory side surface slope changing portion positioned between a lowermost memory side surface slope changing portion and an uppermost memory side surface slope changing portion of three of the memory side surface slope changing portions.

6. The semiconductor device of claim 1, wherein, on the side surface of the vertical memory structure, the plurality of "N" memory side surface slope changing portions are disposed between the at least three gate stack groups adjacent to each other in the vertical direction.

7. The semiconductor device of claim 1, wherein, at a higher level than the uppermost gate layer, the side surface of the separation structure includes a second upper slope changing portion.

8. The semiconductor device of claim 7, wherein the first upper slope changing portion and the second upper slope changing portion are located at substantially a same height level.

9. The semiconductor device of claim 1, further comprising:
a support vertical structure,
wherein
the gate layers are stacked and spaced apart from each other in a first region of the second structure in the vertical direction and extend from the first region of the second structure to a second region of the second structure,
the gate layers include gate pads arranged in a step shape in the second region of the second structure,
the vertical memory structure penetrates through the gate layers in the first region of the second structure,
the support vertical structure penetrates through the gate layers in the second region of the second structure, and
at the height level between the lowermost gate layer and the uppermost gate layer, a side surface of the support vertical structure includes a plurality of "N" support side surface slope changing portions each located at substantially a same height level as the plurality of "N" memory side surface slope changing portions.

10. The semiconductor device of claim 1, further comprising:
a peripheral contact plug that penetrates through a portion of at least the second structure,
wherein the peripheral contact plug is spaced apart from the gate layers of the stack structure, and
at the height level between the lowermost gate layer and the uppermost gate layer, a side surface of the peripheral contact plug includes a plurality of "N" peripheral contact side surface slope changing portions located at substantially a same height level as the plurality of "N" memory side surface slope changing portions.

11. The semiconductor device of claim 10, wherein, at a higher level than the uppermost gate layer, a side surface of the peripheral contact plug includes an upper slope changing portion,
an upper surface of the peripheral contact plug is located at a higher level than an upper surface of the vertical memory structure, and
a lower surface of the peripheral contact plug is located at a lower level than a lower surface of the vertical memory structure.

12. The semiconductor device of claim 1, further comprising:
gate contact plugs,
wherein
the gate layers are stacked in a first region of the second structure in the vertical direction and extend from the first region of the second structure into a second region of the second structure,
the gate layers include gate pads arranged in a step shape in the second region of the second structure,
the gate contact plugs penetrate through the gate pads and electrically connect to the gate pads,
each of the gate contact plugs includes a lower surface at a lower level than the lowermost gate layer and an upper surface at a higher level than the uppermost gate layer, and
at the height level between the lowermost gate layer and the uppermost gate layer, a side surface of one of the gate contact plugs includes a plurality of "N" gate contact side surface slope changing portions located at substantially a same height level as the plurality of "N" memory side surface slope changing portions.

13. The semiconductor device of claim 12, wherein, at a higher level than the uppermost gate layer, a side surface of one of the gate contact plugs includes at least two upper slope changing portions.

14. The semiconductor device of claim 1, wherein the first structure includes a semiconductor substrate, a peripheral circuit on the semiconductor substrate, a peripheral pad that is electrically connected to the peripheral circuit, and a patterned structure located at a higher level than the peripheral pad on the semiconductor substrate,
the separation structure has a lower surface in contact with the patterned structure,
the vertical memory structure has a lower surface in contact with the patterned structure, and
the lower surface of the vertical memory structure is located at a lower level than the lower surface of the separation structure.

15. The semiconductor device of claim 14, wherein the patterned structure includes a first patterned layer, a second patterned layer disposed on the first patterned layer, and a third patterned layer disposed on the second patterned layer,
the vertical memory structure penetrates through the second and third patterned layers and extends into the first patterned layer,
the vertical memory structure includes an insulating gap-filling layer, a channel layer that covers a side surface and a bottom surface of the insulating gap-filling layer, a pad material layer in contact with the channel layer on the insulating gap-filling layer, and a data storage structure that covers an outer surface of at least the channel layer,
the data storage structure includes a first dielectric layer, a second dielectric layer, and a data storage layer between the first and second dielectric layers, and
the second patterned layer penetrates through the data storage structure and contacts the channel layer.

16. A semiconductor device, comprising:
a lower structure;
an upper structure that includes a stack structure and an insulation structure that covers at least a portion of the stack structure;
a vertical memory structure that penetrates through at least the stack structure;
a peripheral contact plug;
a plurality of gate contact plugs; and a separation structure that penetrates through at least the stack structure and has a line shape in a plan view, wherein the stack structure includes at least three gate stack groups that are stacked on the lower structure in a vertical direction, each of the at least three gate stack groups includes gate layers that are stacked and spaced apart from each other in the vertical direction, at a height level between a lowermost gate layer and an uppermost gate layer of the gate layers of the stack structure, a side surface of each of the vertical memory structure and a side surface of each of the peripheral contact plug includes a plurality of "N" first slope changing portions, a side surface of the separation structure includes "M" of second slope changing portion that is located at substantially a same height level as "M" of the first slope changing portion of the plurality of "N" first slope changing portions, wherein "M"< "N", "N" and "M" are natural numbers that differ from each other, at a higher level than the uppermost gate layer, the side surface of the vertical memory structure, the side surface of the peripheral contact plug, the side surface of the separation structure, and a side surface of each of the plurality of gate contact plugs each include a first upper slope changing portion located at substantially a same height level, and at a same height level as the first slope changing portion positioned at a lowermost portion of the plurality of "N" first slope changing portions, the side surface of the separation structure is substantially vertical.

17. The semiconductor device of claim 16, wherein the gate layers are stacked in a first region of the upper structure in the vertical direction and extend from the first region of the upper structure to a second region of the upper structure, the gate layers include gate pads arranged in a step shape in the second region of the upper structure, the gate contact plugs are electrically connected to the gate pads, and at a higher level than the uppermost gate layer, the side surface of each of the gate contact plugs further includes a second upper slope changing portion located at a higher level than the first upper slope changing portion, the first slope changing portions, the second slope changing portion, the first upper slope changing portion, and the second upper slope changing portion each has a first slope located between an upper side surface portion and a lower side surface portion, and the first slope is less steep than a slope of each of the upper side surface portion and the lower side surface portion.

18. A data storage system, comprising:

a main substrate;

a semiconductor device disposed on the main substrate; and a controller that is electrically connected to the semiconductor device on the main substrate, wherein the semiconductor device includes:

a lower structure;

an upper structure that includes a stack structure and an insulation structure that covers at least a portion of the stack structure;

a vertical memory structure that penetrates through at least the stack structure;

a peripheral contact plug;

a plurality of gate contact plugs; and a separation structure that penetrates through at least the stack structure and has a line shape in a plan view, wherein the stack structure includes at least three gate stack groups that are stacked on the lower structure in a vertical direction, each of the at least three gate stack groups includes gate layers that are stacked and spaced apart from each other in the vertical direction, at a height level between a lowermost gate layer and an uppermost gate layer of the gate layers of the stack structure, each of a side surface of the vertical memory structure and a side surface of the peripheral contact plug includes a plurality of "N" first slope changing portions, a side surface of the separation structure includes "M" of second slope changing portion that is located at substantially a same height level as "M" of first slope changing portion of the plurality of "N" first slope changing portions, where "N" and "M" are natural numbers different from each other and "M"< "N", at a higher level than the uppermost gate layer, the side surface of the vertical memory structure, the side surface of the peripheral contact plug, the side surface of the separation structure, and a side surface of each of the gate contact plugs includes a first upper slope changing portion located at substantially a same height level, and at a same height level as the first slope changing portion positioned at the lowermost portion of the "N" first slope changing portions, the side surface of the separation structure is substantially vertical.

19. The data storage system of claim 18, wherein the gate layers are stacked in a first region of the upper structure in the vertical direction and extend from the first region of the upper structure into a second region of the upper structure, the gate layers include gate pads arranged in a step shape in the second region of the upper structure, the gate contact plugs are electrically connected to the gate pads, and at a higher level than the uppermost gate layer, the side surface of each of the gate contact plugs further includes a second upper slope changing portion located at a higher level than the first upper slope changing portion, the first slope changing portions, the second slope changing portion, the first upper slope changing portion, and the second upper slope changing portion each has a first slope located between an upper side surface portion and a lower side surface portion, and the first slope is less steep than a slope of each of the upper side surface portion and the lower side surface portion.

* * * * *